(12) United States Patent
Kato

(10) Patent No.: US 9,713,251 B2
(45) Date of Patent: *Jul. 18, 2017

(54) HIGH-FREQUENCY SIGNAL LINE, METHOD FOR PRODUCING SAME, AND ELECTRONIC DEVICE

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 244 days.

This patent is subject to a terminal disclaimer.

(21) Appl. No.: 14/289,733

(22) Filed: May 29, 2014

(65) Prior Publication Data

US 2014/0262448 A1    Sep. 18, 2014

Related U.S. Application Data

(63) Continuation of application No. PCT/JP2012/080329, filed on Nov. 22, 2012.

(30) Foreign Application Priority Data

Dec. 2, 2011  (JP) ................................. 2011-264540
Aug. 1, 2012  (JP) ................................. 2012-171207

(51) Int. Cl.
*H01P 3/08* (2006.01)
*H05K 1/02* (2006.01)
(Continued)

(52) U.S. Cl.
CPC ........... *H05K 1/0286* (2013.01); *H01P 3/085* (2013.01); *H05K 1/0253* (2013.01);
(Continued)

(58) Field of Classification Search
CPC .................................. H01P 3/08; H01P 3/085
(Continued)

(56) References Cited

U.S. PATENT DOCUMENTS

| 5,701,128 A | 12/1997 | Okada et al. |
| 6,414,573 B1 * | 7/2002 | Swineford .............. H01P 3/087 |
| | | 333/238 |

(Continued)

FOREIGN PATENT DOCUMENTS

| JP | 8-242117 A | 9/1996 |
| JP | 08-265014 A | 10/1996 |

(Continued)

OTHER PUBLICATIONS

Official Communication issued in corresponding Japanese Patent Application No. 2013-547127, mailed on Dec. 16, 2014.
(Continued)

*Primary Examiner* — Stephen E Jones
(74) *Attorney, Agent, or Firm* — Keating & Bennett, LLP

(57) ABSTRACT

A high-frequency signal line includes a laminate of a plurality of insulator layers, a signal line provided on a first principal surface of one of the insulator layers, a first ground conductor provided on a second principal surface of the insulator layer provided with the signal line, the first ground conductor including openings that overlap with the signal conductor, and a second ground conductor provided in or on the laminate so as to be opposed to the first ground conductor with the signal conductor positioned therebetween.

14 Claims, 22 Drawing Sheets

(51) Int. Cl.
*H05K 3/00* (2006.01)
*H05K 1/14* (2006.01)
*H05K 3/46* (2006.01)

(52) U.S. Cl.
CPC ............. *H05K 1/0298* (2013.01); *H05K 3/00* (2013.01); *H05K 1/0225* (2013.01); *H05K 1/147* (2013.01); *H05K 3/4632* (2013.01); *H05K 2201/0141* (2013.01); *H05K 2201/09618* (2013.01); *H05K 2201/09727* (2013.01); *H05K 2201/10189* (2013.01); *Y10T 156/10* (2015.01)

(58) Field of Classification Search
USPC .................................................. 333/238, 246
See application file for complete search history.

(56) References Cited

U.S. PATENT DOCUMENTS

| | | | | |
|---|---|---|---|---|
| 8,461,943 B2* | 6/2013 | Kato | ................... | H01P 1/20363 333/238 |
| 8,525,613 B2* | 9/2013 | Kato | ................... | H05K 1/0253 333/238 |
| 8,653,910 B2* | 2/2014 | Kato | ................... | H05K 1/0253 333/238 |
| 8,659,370 B2* | 2/2014 | Kato | ................... | H05K 1/0253 333/238 |
| 8,975,986 B2* | 3/2015 | Iida | ........................ | H01P 3/082 333/238 |
| 9,007,151 B2* | 4/2015 | Kato | ................... | H05K 1/0253 333/238 |
| 9,130,251 B2* | 9/2015 | Kato | ....................... | H01P 3/085 |
| 9,312,590 B2* | 4/2016 | Kato | ....................... | H01P 3/085 |
| 9,401,531 B2* | 7/2016 | Iida | ........................ | H01P 3/08 |
| 9,401,532 B2* | 7/2016 | Tago | ................... | H05K 1/0225 |
| 9,414,482 B2* | 8/2016 | Kato | ................... | H05K 1/0225 |
| 2012/0133458 A1 | 5/2012 | Kato et al. | | |
| 2013/0057365 A1 | 3/2013 | Mizushima et al. | | |
| 2014/0048312 A1 | 2/2014 | Kato et al. | | |

FOREIGN PATENT DOCUMENTS

| | | |
|---|---|---|
| JP | 2007-123740 A | 5/2007 |
| JP | 2009-105207 A | 5/2009 |
| JP | 2010-135830 A | 6/2010 |
| JP | 2011-061059 A | 3/2011 |
| JP | 2011-071403 A | 4/2011 |
| JP | 2011-138862 A | 7/2011 |
| JP | 2011-211170 A | 10/2011 |
| WO | 2011/007660 A1 | 1/2011 |
| WO | 2011/018934 A1 | 2/2011 |

OTHER PUBLICATIONS

Official Communication issued in corresponding Japanese Patent Application No. 2013-547127, mailed on Mar. 10, 2015.
Official Communication issued in International Patent Application No. PCT/JP2012/080329, mailed on Mar. 12, 2013.

* cited by examiner

F I G. 5A
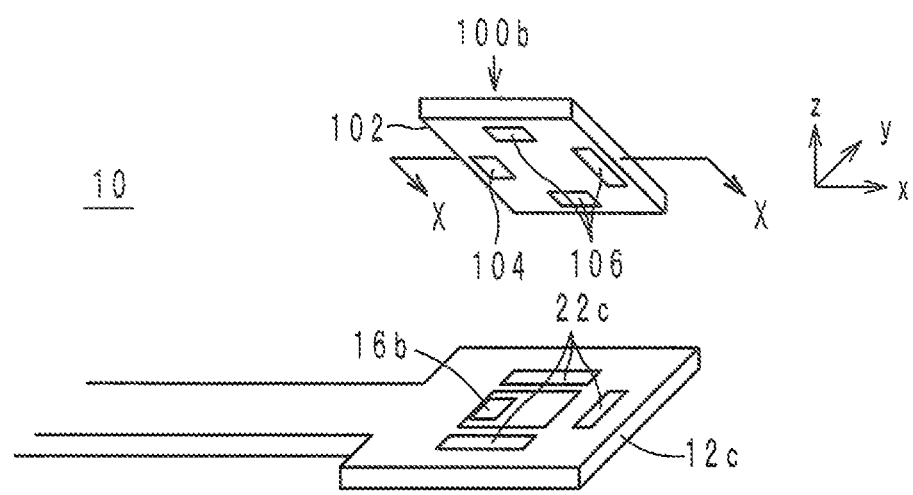
F I G. 5B
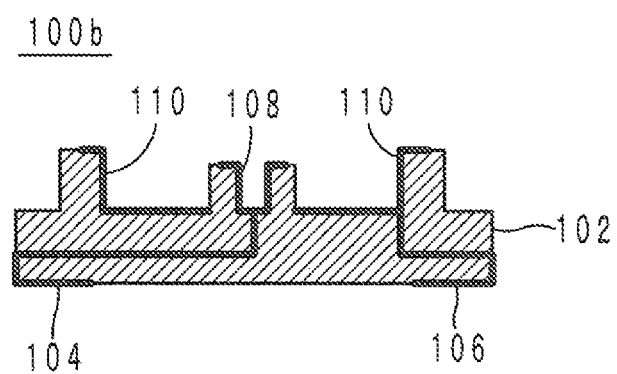

F I G. 6A
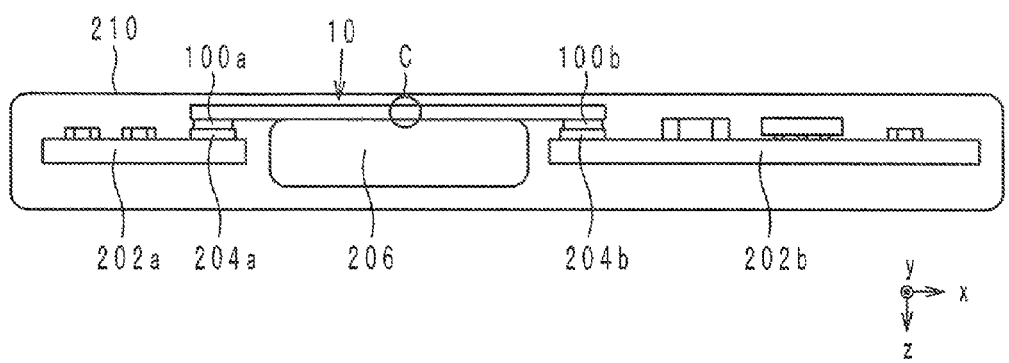
F I G. 6B
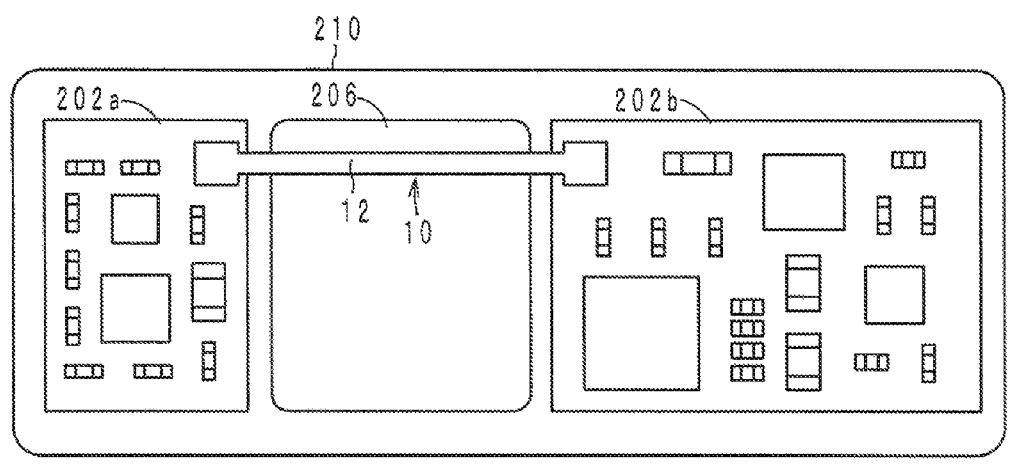

F I G. 10
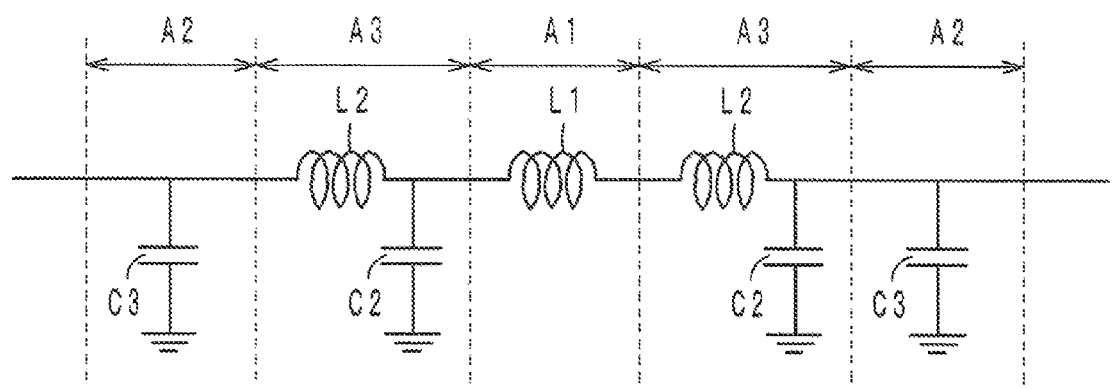

F I G . 1 5
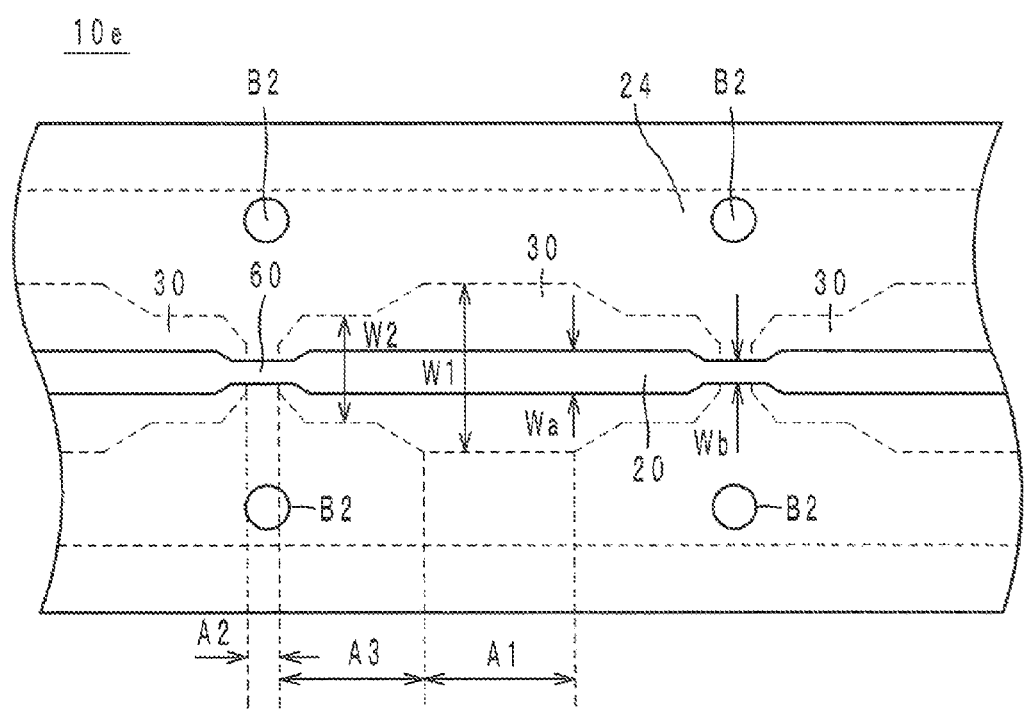
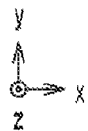

F I G . 17
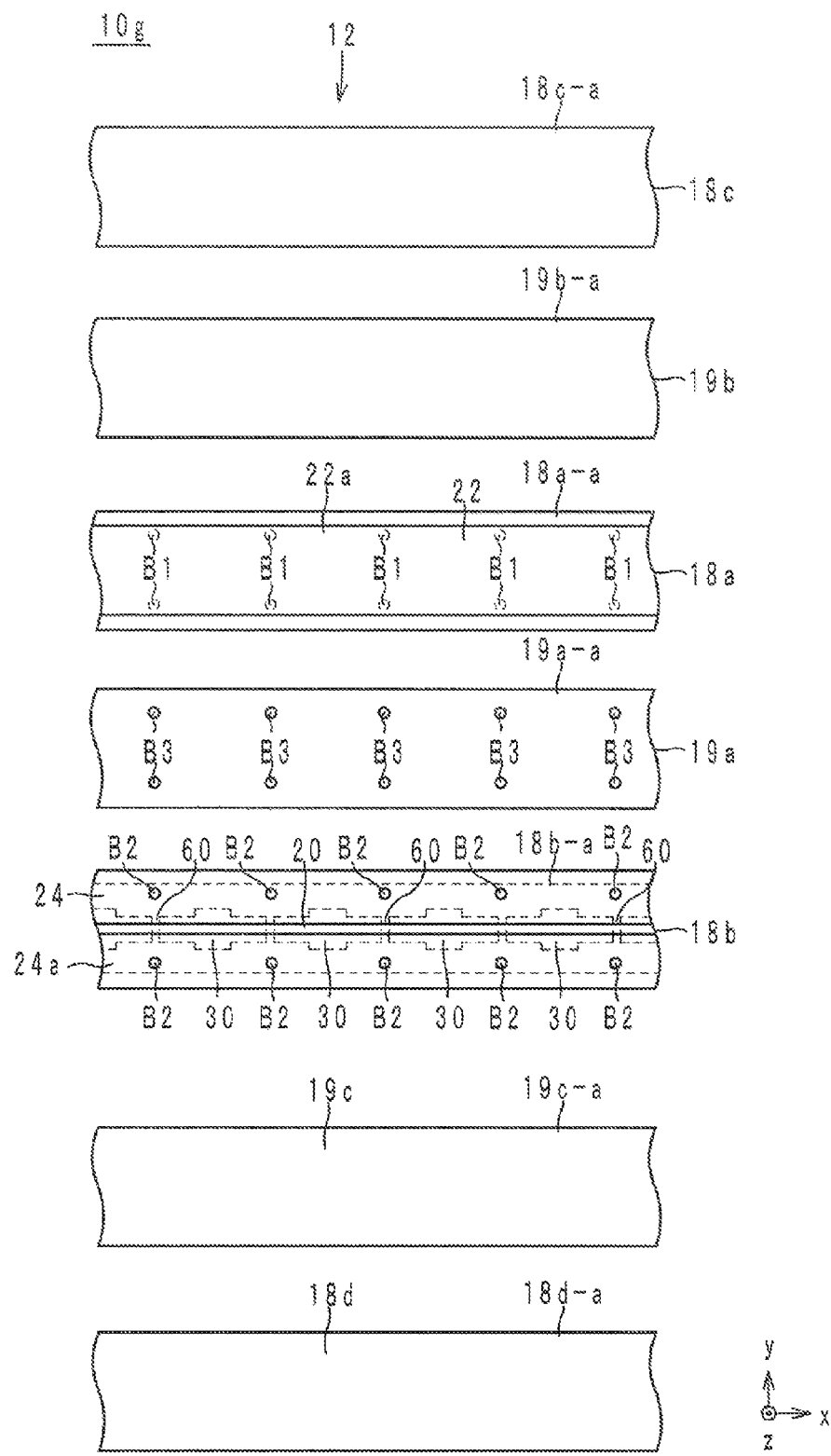

F I G . 2 2
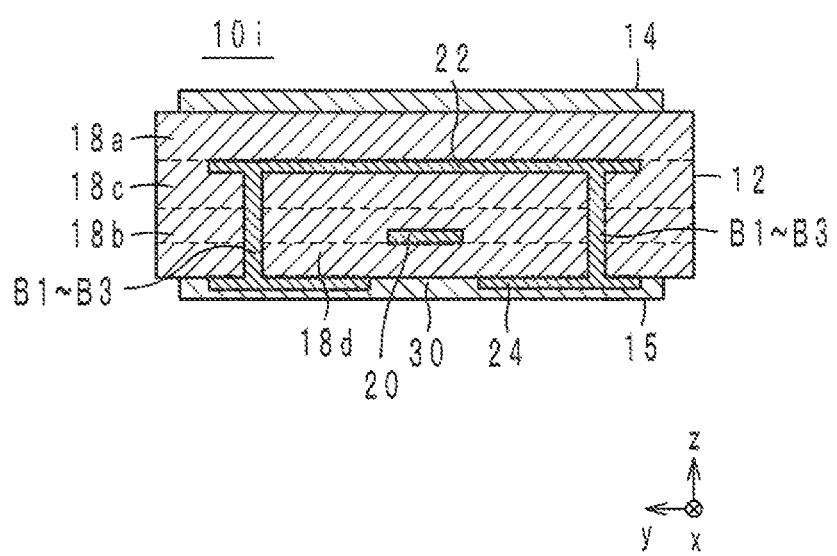

HIGH-FREQUENCY SIGNAL LINE, METHOD FOR PRODUCING SAME, AND ELECTRONIC DEVICE

This application is based on Japanese Patent Application No. 2011-264540 filed on Dec. 2, 2011, Japanese Patent Application No. 2012-171207 filed on Aug. 1, 2012, and International Application No. PCT/JP2012/080329 filed on Nov. 22, 2012, the entire contents of each of which is incorporated herein by reference.

BACKGROUND OF THE INVENTION

1. Field of the Invention

The present invention relates to high-frequency signal lines, methods for producing the same, and electronic devices, more particularly to a high-frequency signal line including a signal line and ground conductors having the signal line positioned therebetween, a method for producing the high-frequency signal line, and an electronic device including the high-frequency signal line.

2. Description of the Related Art

As a high-frequency line for connecting high-frequency circuits, a coaxial cable is typically used. Coaxial cables are widely used because they can be deformed, e.g., bent, easily, and are inexpensive.

Incidentally, recent years have seen high-frequency devices, such as mobile communications terminals, becoming more compact. Accordingly, it is becoming more difficult to provide and maintain space in high-frequency devices for disposing coaxial cables having circular cross sections. Therefore, in some cases, a high-frequency signal line having a stripline provided in a flexible laminate is used.

A tri-plate stripline is structured with a signal line provided between ground conductors. The thickness of such a high-frequency signal line in the direction of lamination is less than the diameter of a typical coaxial cable, and therefore, the high-frequency signal line can be accommodated in a small space where a typical coaxial cable cannot be placed.

Furthermore, as an invention relevant to the high-frequency signal line, a flexible board described in Japanese Patent Laid-Open Publication No. 2007-123740 is known. The flexible board described in Japanese Patent Laid-Open Publication No. 2007-123740 has openings provided in a ground layer, and can be bent readily compared to stripline structures having solid ground conductors with no openings.

However, in the case of the flexible board described in Japanese Patent Laid-Open Publication No. 2007-123740, when dielectric layers are laminated, the dielectric layers might be misaligned with one another, so that the positional relationship between the signal line and the openings in the ground layer can deviate from a predetermined relationship.

SUMMARY OF THE INVENTION

A preferred embodiment of the present invention is directed to a high-frequency signal line including a laminate of a plurality of insulator layers, a signal line provided on a first principal surface of one of the insulator layers, a first ground conductor provided on a second principal surface of the insulator layer provided with the signal line, the first ground conductor including openings that overlap with the signal line, and a second ground conductor provided in or on the laminate so as to be opposed to the first ground conductor with the signal line positioned therebetween.

Another preferred embodiment of the present invention is directed to a method for producing a high-frequency signal line including a laminate formed by laminating first and second insulator layers, a signal line provided on a first principal surface of the first insulator layer, a first ground conductor formed on a second principal surface of the first insulator layer and having openings provided so as to overlap with the signal line, and a second ground conductor formed on a first principal surface of the second insulator layer and opposed to the first ground conductor with the signal line positioned therebetween, the first insulator layer being positioned above the second insulator layer such that the first principal surface of the first insulator layer is opposed to a second principal surface of the second insulator layer, the method including a first step for forming the signal line on the first principal surface of the first insulator layer; a second step for forming the first ground conductor on the second principal surface of the first insulator layer; a third step for forming the second ground conductor on the first principal surface of the second insulator layer; and a fourth step for forming the laminate by laminating the first insulator layer and the second insulator layer.

Another preferred embodiment of the present invention is directed to an electronic device including a housing, and a high-frequency signal line accommodated in the housing. The high-frequency signal line includes a laminate formed by laminating a plurality of insulator layers, a signal line provided on a first principal surface of one of the insulator layers, a first ground conductor provided on a second principal surface of the insulator layer provided with the signal line, the first ground conductor including openings that overlap with the signal line, and a second ground conductor provided in or on the laminate so as to be opposed to the first ground conductor with the signal line positioned therebetween.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5A is an external oblique view of a connector of the high-frequency signal line.

FIG. 5B is a cross-sectional structure view of the connector of the high-frequency signal line.

FIGS. 6A and 6B illustrate an electronic device provided with a high-frequency signal line as viewed in plan views in y-axis and z-axis directions, respectively.

FIG. 10 is an equivalent circuit diagram of a portion of the high-frequency signal line according to the first modification of a preferred embodiment of the present invention.

FIG. 15 is a perspective view of the high-frequency signal line in FIG. 14 as seen in the z-axis direction.

FIG. 17 is an exploded view of a laminate of a high-frequency signal line according to a seventh modification of a preferred embodiment of the present invention.

FIG. 22 is a cross-sectional structure view of a high-frequency signal line according to a ninth modification of a preferred embodiment of the present invention.

DETAILED DESCRIPTION OF THE PREFERRED EMBODIMENTS

Figure 1:
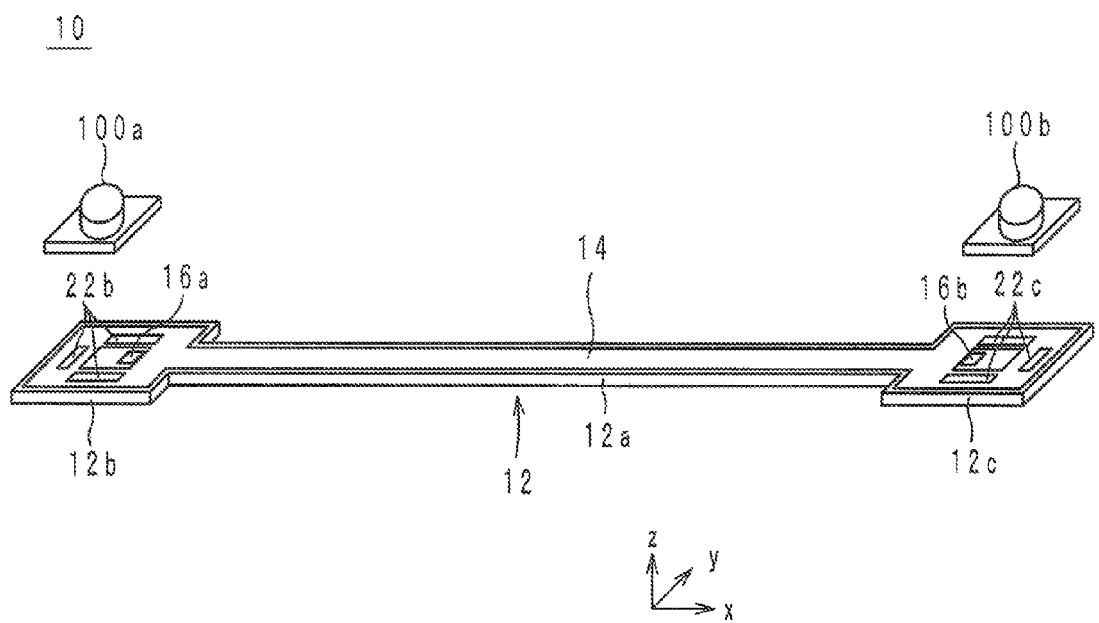
FIG. 1 is an external oblique view of a high-frequency signal line according to a preferred embodiment of the present invention.
Figure 2:
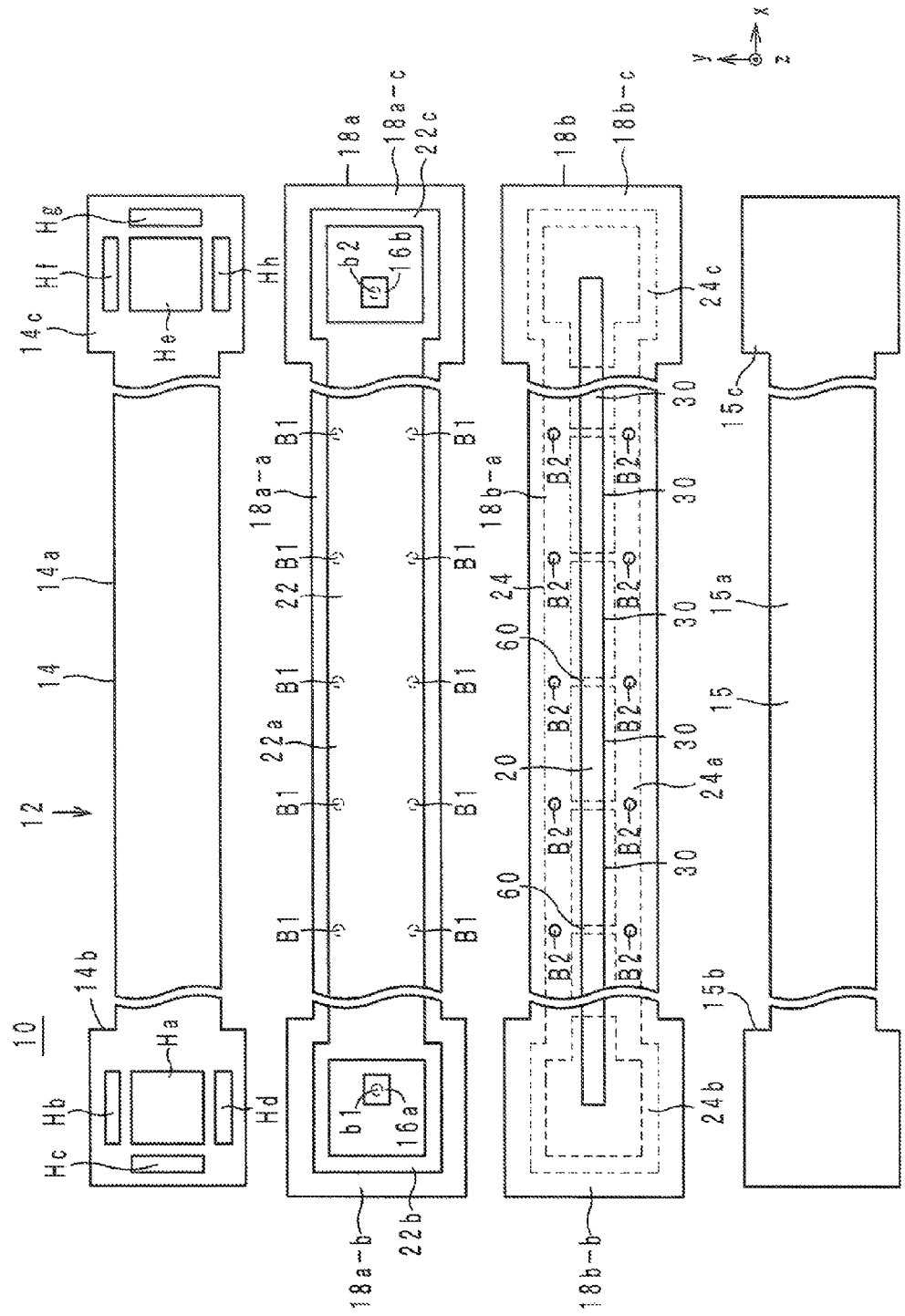
FIG. 2 is an exploded view of a dielectric element assembly of the high-frequency signal line in FIG. 1.
Figure 3:
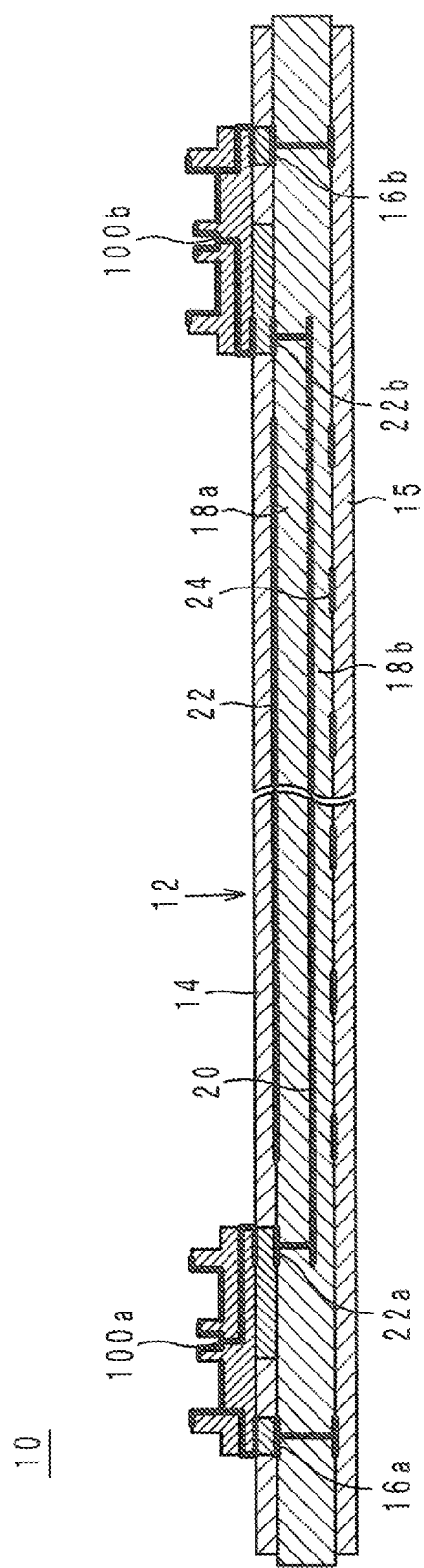
FIG. 3 is a cross-sectional structure view of the high-frequency signal line in FIG. 1.
Figure 4:
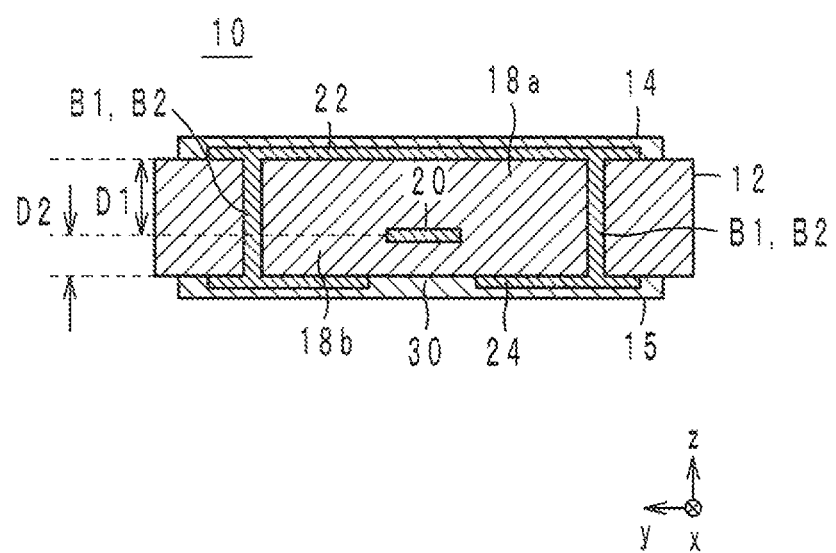
FIG. 4 is another cross-sectional structure view of the high-frequency signal line.

Hereinafter, a high-frequency signal line according to various preferred embodiments of the present invention, along with a method for producing the high-frequency signal line, and an electronic device including the high-frequency signal line, will be described with reference to the drawings. An example of a configuration of the high-frequency signal line according to a preferred embodiment of the present invention will be described below with reference to the drawings. FIG. 1 is an external oblique view of the high-frequency signal line 10 according to a preferred embodiment of the present invention. FIG. 2 is an exploded view of a dielectric element assembly 12 of the high-frequency signal line 10 in FIG. 1. FIG. 3 is a cross-sectional structure view of the high-frequency signal line 10 in FIG. 1. FIG. 4 is another cross-sectional structure view of the high-frequency signal line 10. FIG. 5A is an external oblique view of a connector 100b of the high-frequency signal line 10. FIG. 5B is a cross-sectional structure view of the connector 100b. In FIGS. 1 through 5B, the direction of lamination of the high-frequency signal line 10 will be defined as a z-axis direction. Moreover, the longitudinal direction of the high-frequency signal line 10 will be defined as an x-axis direction, and the direction perpendicular to the x-axis and z-axis directions will be defined as a y-axis direction.

The high-frequency signal line 10 is preferably for use in, for example, an electronic device such as a cell phone, to connect two high-frequency circuits. The high-frequency signal line 10 includes the dielectric element assembly 12, protective layers 14 and 15, external terminals 16 (16a and 16b), a signal line 20, a reference ground conductor 22, an auxiliary ground conductor 24, via-hole conductors b1, b2, B1, and B2, a connector 100a, and the connector 100b, as shown in FIGS. 1 through 3.

The dielectric element assembly 12 is a flexible plate-shaped member, which, when viewed in a plan view in the z-axis direction, extends in the x-axis direction, and includes a line portion 12a, and connecting portions 12b and 12c. The dielectric element assembly 12 is a laminate preferably formed by laminating dielectric sheets (insulator layers) 18 (18a and 18b) in this order, from the positive side to the negative side in the z-axis direction, as shown in FIG. 2. In the following, the principal surface of the dielectric element assembly 12 that is located on the positive side in the z-axis direction will be referred to as a top surface (first principal surface), and the principal surface of the dielectric element assembly 12 that is located on the negative side in the z-axis direction will be referred to as a bottom surface (second principal surface).

The line portion 12a extends in the x-axis direction. The connecting portion 12b preferably has a rectangular or substantially rectangular shape connected to the end of the line portion 12a on the negative side in the x-axis direction, and the connecting portion 12c preferably has a rectangular or substantially rectangular shape connected to the end of the line portion 12a on the positive side in the x-axis direction. The width of each of the connecting portions 12b and 12c in the y-axis direction is greater than the width of the line portion 12a in the y-axis direction.

The dielectric sheets 18, when viewed in a plan view in the z-axis direction, extend in the x-axis direction, and preferably have the same or substantially the same shape as the dielectric element assembly 12. The dielectric sheets 18 are made of a flexible thermoplastic resin such as polyimide or liquid crystal polymer. In the following, the principal surface of each of the dielectric sheets 18 that is located on the positive side in the z-axis direction will be referred to as a top surface, and the principal surface of each of the dielectric sheets 18 that is located on the negative side in the z-axis direction will be referred to as a bottom surface.

The dielectric sheet (second insulator layer) 18a is laminated on the top surface of the dielectric sheet (first insulator layer) 18b. The thickness D1 of the dielectric sheet 18a is greater than the thickness D2 of the dielectric sheet 18b, as shown in FIG. 4. For example, the thickness D1 preferably is about 50 μm to about 300 μm after lamination of the dielectric sheets 18a and 18b. In the present preferred embodiment, the thickness D1 preferably is about 175 μm, for example. Moreover, the thickness D2 preferably is about 10 μm to about 100 μm, for example. In the present preferred embodiment, the thickness D2 preferably is about 25 μm, for example. The ratio of T2 to T1 preferably ranges from about 1:2 to about 1:7, for example.

Furthermore, the dielectric sheet 18a includes a line portion 18a-a and connecting portions 18a-b and 18a-c. The dielectric sheet 18b includes a line portion 18b-a and connecting portions 18b-b and 18b-c. The line portions 18a-a and 18b-a constitute the line portion 12a. The connecting portions 18a-b and 18b-b constitute the connecting portion 12b. The connecting portions 18a-c and 18b-c constitute the connecting portion 12c.

The external terminal 16a preferably is a rectangular or substantially rectangular conductor provided near the center of the top surface of the connecting portion 18a-b, as shown in FIGS. 1 and 2. The external terminal 16b preferably is a rectangular or substantially rectangular conductor provided near the center of the top surface of the connecting portion 18a-c, as shown in FIGS. 1 and 2. The external terminals 16a and 16b are preferably made of a metal material mainly composed of silver or copper and having a low specific resistance. In addition, the top surfaces of the external terminals 16a and 16b preferably are plated with gold.

The signal line 20 is a linear conductor provided on the top surface of the dielectric sheet 18b so as to extend in the x-axis direction, as shown in FIG. 2. The signal line 20, when viewed in a plan view in the z-axis direction, overlaps with the external terminals 16a and 16b at opposite ends. The width of the signal line 20 preferably is, for example, about 100 µm to about 500 µm. In the present preferred embodiment, the width of the signal line 20 preferably is about 300 µm, for example. The signal line 20 is preferably made of a metal material mainly composed of silver or copper and having a low specific resistance. Here, the signal line 20 is formed on the top surface of the dielectric sheet 18b preferably by patterning metal foil formed by plating the top surface of the dielectric sheet 18b or by patterning metal foil attached to the top surface of the dielectric sheet 18b. Moreover, the top surface of the signal line 20 is smoothened, so that surface roughness of the signal line 20 is greater on the side that contacts the dielectric sheet 18b than on the side that does not contact the dielectric sheet 18b.

The reference ground conductor 22 is provided on the positive side in the z-axis direction relative to the signal line 20, as shown in FIG. 2, and more specifically, the reference ground conductor 22 is provided on the top surface of the dielectric sheet 18a, which is closest to the top surface of the dielectric element assembly 12. Here, the reference ground conductor 22 is formed on the top surface of the dielectric sheet 18a preferably by patterning metal foil formed by plating the top surface of the dielectric sheet 18a or by patterning metal foil attached to the top surface of the dielectric sheet 18a. Moreover, the top surface of the reference ground conductor 22 is smoothened, so that surface roughness of the reference ground conductor 22 is greater on the side that contacts the dielectric sheet 18a than on the side that does not contact the dielectric sheet 18a. The reference ground conductor 22 extends along the top surface of the dielectric sheet 18a in the x-axis direction, and is opposed to the signal line 20 with the dielectric sheet 18a positioned therebetween. There are essentially no openings provided in the portion of the reference ground conductor 22 that is opposed to the signal line 20. That is, the reference ground conductor 22 is a so-called solid electrode extending continuously in the x-axis direction along the signal line 20 in the line portion 12a. Note that the reference ground conductor 22 does not have to cover the line portion 12a completely, and, for example, it may have microscopic holes provided at predetermined positions such that gases generated by thermocompression bonding of the thermoplastic resin in the dielectric sheets 18 are allowed to escape therefrom. The reference ground conductor 22 is preferably made of a metal material mainly composed of silver or copper and having a low specific resistance.

Here, the characteristic impedance of the high-frequency signal line 10 is determined mainly by the opposed areas of the signal line 20 and the reference ground conductor 22 and the distance therebetween, as well as by the relative permittivities of the dielectric sheets 18a to 18d. Therefore, in the case where the characteristic impedance of the high-frequency signal line 10 is to be set to about 50Ω, for example, the characteristic impedance of the high-frequency signal line 10 is designed to become about 55Ω, slightly higher than about 50Ω, because of the influence of the signal line 20 and the reference ground conductor 22. Moreover, the auxiliary ground conductor 24 is shaped, as will be described later, such that the characteristic impedance of the high-frequency signal line 10 becomes about 50Ω, because of the influence of the signal line 20, the reference ground conductor 22, and the auxiliary ground conductor 24.

Furthermore, the reference ground conductor 22 includes a line portion 22a and terminal portions 22b and 22c. The line portion 22a is provided on the top surface of the line portion 18a-a, and extends in the x-axis direction. The terminal portion 22b is provided on the top surface of the connecting portion 18a-b, preferably in the form of a rectangular or substantially rectangular rim around the external terminal 16a. The terminal portion 22b is connected to the end of the line portion 22a on the negative side in the x-axis direction. The terminal portion 22c is provided on the top surface of the connecting portion 18a-c, in the form of a rectangular or substantially rectangular rim around the external terminal 16b. The terminal portion 22c is connected to the end of the line portion 22a on the positive side in the x-axis direction.

The auxiliary ground conductor 24 is provided in the dielectric element assembly 12 on the negative side in the z-axis direction relative to the signal line 20, as shown in FIG. 2, and more specifically, the auxiliary ground conductor 24 is positioned on the bottom surface of the dielectric sheet 18b on which the signal line 20 is provided. Here, the auxiliary ground conductor 24 is formed on the bottom surface of the dielectric sheet 18b preferably by patterning metal foil formed by plating the bottom surface of the dielectric sheet 18b or by patterning metal foil attached to the bottom surface of the dielectric sheet 18b. Moreover, the top surface of the auxiliary ground conductor 24 is smoothened, so that surface roughness of the auxiliary ground conductor 24 is greater on the side that contacts the dielectric sheet 18b than on the side that does not contact the dielectric sheet 18b. The auxiliary ground conductor 24 extends along the bottom surface of the dielectric sheet 18b in the x-axis direction, and is opposed to the signal line 20 with the dielectric sheet 18b positioned therebetween. That is, the auxiliary ground conductor 24 is opposite to the reference ground conductor 22 with the signal line 20 positioned therebetween. The auxiliary ground conductor 24 is preferably made of a metal material mainly composed of silver or copper and having a low specific resistance.

The auxiliary ground conductor 24 is a ground conductor that doubles as a shield. Moreover, the auxiliary ground conductor 24 is configured to make fine adjustments such that the characteristic impedance of the high-frequency signal line 10 is set to about 50Ω, as described above. In addition, the interval between bridge portions 60 of the auxiliary ground conductor 24 in the x-axis direction is designed such that radiation noise does not occur within a frequency band to be used. In the following, the principal surface of the auxiliary ground conductor 24 that is located on the positive side in the z-axis direction will be referred to as a top surface, and the principal surface of the auxiliary ground conductor 24 that is located on the negative side in the z-axis direction will be referred to as a bottom surface.

Furthermore, the auxiliary ground conductor 24 includes a line portion 24a and terminal portions 24b and 24c. The line portion 24a is provided on the bottom surface of the line portion 18b-a, and extends in the x-axis direction. More specifically, the line portion 24a is provided in ladder-shaped configuration in which a plurality of openings 30 where no conductor layer is provided are arranged along the signal line 20, so as to alternate with the bridge portions 60 where a conductor layer is provided. The openings 30 are preferably rectangular or substantially rectangular, and overlap with the signal line 20 when viewed in a plan view in the z-axis direction, as shown in FIGS. 2 and 4. Accordingly, the signal line 20, when viewed in a plan view in the z-axis direction, overlaps alternatingly with the openings 30 and the bridge portions 60. In addition, the openings 30 are arranged at equal intervals. In the present preferred embodiment, the interval between the openings 30 in the y-axis direction preferably is about 400 μm, for example.

The terminal portion 24b is provided on the bottom surface of the connecting portion 18b-b, preferably in the form of a rectangular or substantially rectangular rim. The terminal portion 24b is connected to the end of the line portion 24a on the negative side in the x-axis direction. The terminal portion 24c is provided on the bottom surface of the connecting portion 18b-c, preferably in the form of a rectangular or substantially rectangular rim. The terminal portion 24c is connected to the end of the line portion 24a on the positive side in the x-axis direction.

In this manner, the signal line 20 is positioned between the reference ground conductor 22 and the auxiliary ground conductor 24, which are located on opposite sides in the z-axis direction, with the dielectric layers 18a and 18b intervening therebetween. That is, the signal line 20, the reference ground conductor 22, and the auxiliary ground conductor 24 define a tri-plate stripline structure. Moreover, the distance between the signal line 20 and the reference ground conductor 22 preferably is, for example, about 50 μm to about 300 μm, which is equal or approximately equal to the thickness D1 of the dielectric sheet 18a, as shown in FIG. 4. In the present preferred embodiment, the distance between the signal line 20 and the reference ground conductor 22 preferably is about 175 μm, for example. On the other hand, the distance between the signal line 20 and the auxiliary ground conductor 24 preferably is, for example, about 10 μm to about 100 μm, which is equal or approximately equal to the thickness D2 of the dielectric sheet 18b, as shown in FIG. 4. In the present preferred embodiment, the distance between the signal line 20 and the auxiliary ground conductor 24 preferably is about 25 μm, for example. That is, the distance between the signal line 20 and the auxiliary ground conductor 24 is preferably less than the distance between the signal line 20 and the reference ground conductor 22.

Since the thickness T1 is greater than the thickness T2, the value of the capacitance that is created between the reference ground conductor 22 and the signal line 20 becomes smaller, so that the width of the signal line 20 is increased to achieve a predetermined impedance value (e.g., about 50Ω). This results in a lower transmission loss, leading to enhanced electrical characteristics of the high-frequency signal line. In the present preferred embodiment, the capacitance between the reference ground conductor 22 and the signal line 20 is a main factor of impedance design, and the impedance of the auxiliary ground conductor 24 is designed such that the auxiliary ground conductor 24 serves to reduce signal radiation. Specifically, the reference ground conductor 22 and the signal line 20 set the characteristic impedance of the high-frequency signal line to be high (e.g., about 70Ω), and the auxiliary ground conductor 24 is added to the high-frequency signal line in order to provide sections where the impedance is lower (e.g., about 30Ω), so that the impedance of the entire high-frequency signal line becomes a predetermined value (e.g., about 50Ω).

The via-hole conductor b1 pierces through the connecting portion 18a-b of the dielectric sheet 18a in the z-axis direction, thus connecting the external terminal 16a to the end of the signal line 20 that is located on the negative side in the x-axis direction. The via-hole conductor b2 pierces through the connecting portion 18a-c of the dielectric sheet 18a in the z-axis direction, thus connecting the external terminal 16b to the end of the signal line 20 that is located on the positive side in the x-axis direction. As a result, the signal line 20 is connected between the external terminals 16a and 16b. The via-hole conductors b1 and b2 are made of a metal material mainly composed of silver or copper and having a low specific resistance.

The via-hole conductors B1 are provided so as to pierce through the line portion 18a-a of the dielectric sheet 18a in the z-axis direction. The via-hole conductors B2 are provided so as to pierce through the line portion 18b-a of the dielectric sheet 18b in the z-axis direction. In addition, the via-hole conductors B1 and B2 are connected to each other, such that each pair constitutes a single via-hole conductor, thus connecting the reference ground conductor 22 and the auxiliary ground conductor 24. The via-hole conductors B1 and B2 are made of a metal material mainly composed of silver or copper and having a low specific resistance.

The protective layer 14 is an insulating film covering approximately the entire top surface of the dielectric sheet 18a. Accordingly, the reference ground conductor 22 is covered by the protective layer 14. The protective layer 14 is made of, for example, a flexible resin such as a resist material.

Furthermore, the protective layer 14 includes a line portion 14a and connecting portions 14b and 14c, as shown in FIG. 2. The line portion 14a covers the entire top surface of the line portion 18a-a, including the line portion 22a.

The connecting portion 14b is connected to the end of the line portion 14a on the negative side in the x-axis direction, so as to cover the top surface of the connecting portion 18a-b. The connecting portion 14b includes openings Ha to Hd provided therein. The opening Ha preferably is a rectangular or substantially rectangular opening positioned at the center of the connecting portion 14b. The external terminal 16a is exposed to the outside from the opening Ha. The opening Hb preferably is a rectangular or substantially rectangular opening provided on the positive side in the y-axis direction relative to the opening Ha. The opening Hc preferably is a rectangular or substantially rectangular opening provided on the negative side in the x-axis direction relative to the opening Ha. The opening Hd preferably is a rectangular or substantially rectangular opening provided on the negative side in the y-axis direction relative to the opening Ha. The terminal portion 22b is exposed to the outside from the openings Hb to Hd, so that the exposed portions define and serve as external terminals.

The connecting portion 14c is connected to the end of the line portion 14a on the positive side in the x-axis direction, so as to cover the top surface of the connecting portion 18a-c. The connecting portion 14c includes openings He to Hh provided therein. The opening He preferably is a rectangular or substantially rectangular opening positioned at the center of the connecting portion 14c. The external terminal 16b is exposed to the outside from the opening He. The opening Hf preferably is a rectangular or substantially rectangular opening provided on the positive side in the y-axis direction relative to the opening He. The opening Hg preferably is a rectangular or substantially rectangular opening provided on the positive side in the x-axis direction relative to the opening He. The opening Hh preferably is a rectangular or substantially rectangular opening provided on the negative side in the y-axis direction relative to the opening He. The terminal portion 22c is exposed to the outside from the openings Hf to Hh, so that the exposed portions serve as external terminals.

The protective layer 15 is an insulating film covering the entire or substantially the entire bottom surface of the dielectric sheet 18b. Accordingly, the auxiliary ground conductor 24, including the openings 30, is covered by the protective layer 15. The protective layer 15 is made of, for example, a flexible resin such as a resist material.

Furthermore, the protective layer 15 includes a line portion 15a and connecting portions 15b and 15c, as shown in FIG. 2. The line portion 15a covers the entire bottom surface of the line portion 18b-a, including the line portion 24a.

The connecting portion 15b is connected to the end of the line portion 15a on the negative side in the x-axis direction, so as to cover the bottom surface of the connecting portion 18b-b. As a result, the terminal portion 24b is covered by the connecting portion 15b. The connecting portion 15c is connected to the end of the line portion 15b on the positive side in the x-axis direction, so as to cover the bottom surface of the connecting portion 18b-c. As a result, the terminal portion 24c is covered by the connecting portion 15c.

The connectors 100a and 100b are mounted on the top surfaces of the connecting portions 12b and 12c, respectively. The connectors 100a and 100b are preferably configured in the same manner, and therefore, only the configuration of the connector 100b will be described below by way of example.

The connector 100b includes a connector body 102, external terminals 104 and 106, a center conductor 108, and an external conductor 110, as shown in FIGS. 1, 5A, and 5B. The connector body 102 includes a rectangular or substantially rectangular plate and a cylindrical or substantially cylindrical portion coupled thereon, and is made of an insulating material such as resin.

The external terminal 104 is positioned on the plate of the connector body 102 on the negative side in the z-axis direction, so as to face the external terminal 16b. The external terminal 106 is positioned on the plate of the connector body 102 on the negative side in the z-axis direction, so as to correspond to the portions of the terminal portion 22c that are exposed from the openings Hf to Hh.

The center conductor 108 is positioned at the center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminal 106. The external conductor 110 is a ground terminal to be kept at a ground potential.

The connector 100b thus configured is mounted on the top surface of the connecting portion 12c, such that the external terminal 104 is connected to the external terminal 16b, and the external terminal 106 is connected to the terminal portion 22c. As a result, the signal line 20 is electrically connected to the center conductor 108. In addition, the reference ground conductor 22 and the auxiliary ground conductor 24 are electrically connected to the external conductor 110.

Figure 7:
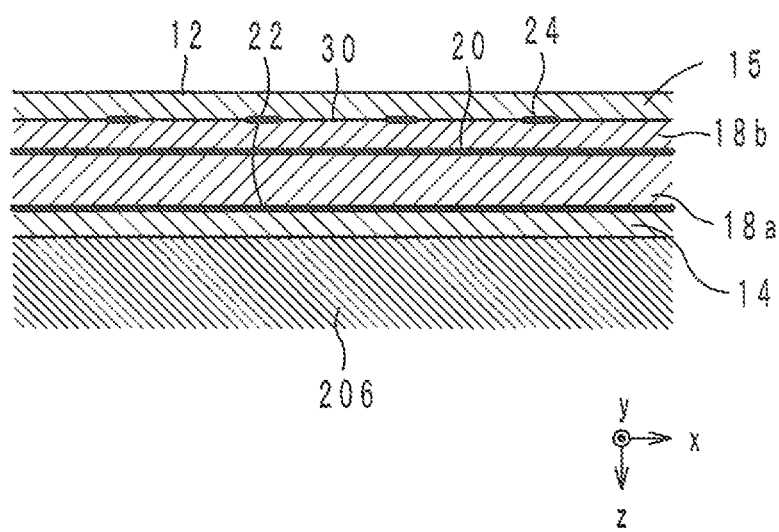
FIG. 7 is a cross-sectional structure view illustrating a circled portion C in FIG. 6A.

The high-frequency signal line 10 is used in a manner as will be described below. FIGS. 6A and 6B illustrate an electronic device 200 provided with the high-frequency signal line 10 as viewed in plan views in the y-axis and z-axis directions, respectively. FIG. 7 is a cross-sectional structure view illustrating a circled portion C in FIG. 6A.

The electronic device 200 includes the high-frequency signal line 10, circuit boards 202a and 202b, receptacles 204a and 204b, a battery pack (metallic body) 206, and a housing 210.

The housing 210 accommodates the circuit boards 202a and 202b, the receptacles 204a and 204b, and the battery pack 206. For example, the circuit board 202a has provided thereon a transmission or reception circuit including an antenna. The circuit board 202b includes, for example, a power circuit provided thereon. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The receptacles 204a and 204b are provided on the principal surfaces of the circuit boards 202a and 202b, respectively, on the negative side in the z-axis direction. The receptacles 204a and 204b are connected to the connectors 100a and 100b, respectively. As a result, high-frequency signals to be transmitted between the circuit boards 202a and 202b at a frequency of, for example, about 2 GHz are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the high-frequency signal line 10 connects the circuit boards 202a and 202b, both electrically and physically.

Here, the top surface of the high-frequency signal line 10 (more precisely, the protective layer 14) is in contact with the battery pack 206, as shown in FIG. 7. The high-frequency signal line 10 and the battery pack 206 are fixed by an adhesive or other fixing material or member. The top surface of the high-frequency signal line 10 is a principal surface positioned on the side of the reference ground conductor 22 relative to the signal line 20. Accordingly, the reference ground conductor 22 in the form of a solid (extending continuously in the x-axis direction) is positioned between the signal line 20 and the battery pack 206.

An example of a method for producing the high-frequency signal line 10 will be described below with reference to FIG. 2. While the following description focuses on one high-frequency signal line 10 as an example, in actuality, large-sized dielectric sheets preferably are laminated and cut, so that a plurality of high-frequency signal lines 10 preferably are produced at the same time.

Prepared first are dielectric sheets 18 made of a thermoplastic resin and having their entire top surfaces copper-foiled (i.e., coated with metal films). More specifically, the top surface of the dielectric sheet 18a is plated with copper foil. Further, the opposite surfaces of the dielectric sheet 18b are plated with copper foil. Still further, the copper-foiled surfaces of the dielectric sheets 18 are smoothened, for example, by galvanization for rust prevention. The dielectric sheets 18 preferably are sheets of liquid crystal polymer. The thickness of the copper foil preferably is about 10 μm to about 20 μm, for example.

Next, external terminals 16 and a reference ground conductor 22, as shown in FIG. 2, are formed on the top surface of the dielectric sheet 18a by patterning the copper foil on the top surface of the dielectric sheet 18a. Specifically, resists are printed on the copper foil of the dielectric sheet 18a in the same shapes as the external terminals 16 (16a and 16b) and the reference ground conductor 22 shown in FIG.

2. Then, any portions of the copper foil that are not coated with the resists are removed by etching the copper foil. Thereafter, the resists are removed. In this manner, the external terminals 16 and the reference ground conductor 22, as shown in FIG. 2, are formed on the top surface of the dielectric sheet 18a by photolithography.

Next, a signal line 20, as shown in FIG. 2, is formed on the top surface of the dielectric sheet 18b by patterning the copper foil on the top surface of the dielectric sheet 18b. Specifically, a resist is printed on the copper foil on the top surface of the dielectric sheet 18b in the same shape as the signal line 20 shown in FIG. 2. Then, any portions of the copper foil that are not coated with the resist are removed by etching the copper foil. Thereafter, the resist is removed. In this manner, the signal line 20, as shown in FIG. 2, is formed on the top surface of the dielectric sheet 18b by photolithography.

Next, the copper foil on the bottom surface of the dielectric sheet 18b is patterned using the signal line 20 as a positioning marker, thus forming an auxiliary ground conductor 24, as shown in FIG. 2, on the bottom surface of the dielectric sheet 18b. Specifically, an resist is printed on the copper foil on the bottom surface of the dielectric sheet 18b in the same shape as the auxiliary ground conductor 24 shown in FIG. 2, using the signal line 20 as a positioning marker. Then, any portions of the copper foil that are not coated with the resist are removed by etching the copper foil. Thereafter, the resist is removed. In this manner, the auxiliary ground conductor 24, as shown in FIG. 2, is formed on the bottom surface of the dielectric sheet 18b by photolithography.

Note that the auxiliary ground conductor 24 may be formed before the signal line 20. In such a case, the signal line 20 is formed on the top surface of the dielectric sheet 18b using the auxiliary ground conductor 24 as a positioning marker. Alternatively, the signal line 20 and the auxiliary ground conductor 24 may be formed at the same time.

Next, via-holes are bored through the dielectric sheets 18a and 18b by irradiating their bottom surfaces with laser beams where via-hole conductors b1, b2, B1, and B2 are to be formed. Thereafter, the via-holes provided in the dielectric sheets 18a and 18b are filled with a conductive paste.

Next, a laminate 12 is formed by laminating the dielectric sheets 18a and 18b in this order, from the positive side to the negative side in the z-axis direction, such that the reference ground conductor 22, the signal line 20, and the auxiliary ground conductor 24 define a stripline structure. Then, the dielectric sheets 18a and 18b are heated and pressed from both the positive and negative sides in the z-axis direction, thus softening the dielectric sheets 18a and 18b so as to be bonded and integrated, while solidifying the conductive paste in the via-holes, so that the via-hole conductors b1, b2, B1, and B2 are formed, as shown in FIG. 2. Note that the via-hole conductors b1, b2, B1, and B2 may be formed after the dielectric sheets 18 are integrated, by providing via-holes in the dielectric sheets 18 and filling the via-holes with a conductive paste or forming a plated coating over the via-holes.

Next, a resin (resist) paste is applied to the top surface of the dielectric sheet 18a, thus forming a protective layer 14 so as to cover the reference ground conductor 22. Further, a resin (resist) paste is applied to the bottom surface of the dielectric sheet 18b, thus forming a protective layer 15 so as to cover the auxiliary ground conductor 24. As a result, the high-frequency signal line 10 shown in FIG. 1 is obtained.

The high-frequency signal line 10 thus configured and the method for producing the same render it possible to inhibit deviation of the predetermined desired positional relationship between the signal line 20 and the openings 30 of the auxiliary ground conductor 24. More specifically, in the case of the flexible board described in Japanese Patent Laid-Open Publication No. 2007-123740, the signal line and the ground layer are formed on different dielectric layers. Therefore, when the dielectric layers are laminated, they are misaligned with one another, so that the positional relationship between the signal line and the openings in the ground layer deviates from a predetermined relationship.

Here, such misalignment among laminated layers is industrially assumed to be about ±50 μm, resulting in variations in capacitance created between the auxiliary ground conductor 24 and the signal line 20, and further, the auxiliary ground conductor 24 and the signal line 20 become closer to each other, resulting in reduced inductance. In particular, for example, in the case where the difference between the width of the signal line 20 and the width of the opening 30 in the y-axis direction is set smaller, for example, by increasing the width of the signal line 20 (e.g., about 300 μm) and reducing the width of the opening 30 in the y-axis direction (e.g., about 400 μm), the misalignment among laminated layers increases the influence of the variations in capacitance created between the auxiliary ground conductor 24 and the signal line 20 and the reduced inductance. As a result, the electrical characteristics of the high-frequency signal line 10 are affected significantly.

Therefore, in the high-frequency signal line 10, the signal line 20 is positioned on the top surface of the dielectric sheet 18b, and the auxiliary ground conductor 24 provided with the openings 30 is positioned on the bottom surface of the dielectric sheet 18b. As a result, it is rendered possible to inhibit the positional relationship between the signal line 20 and the openings 30 of the auxiliary ground conductor 24 from being shifted when the dielectric sheets 18a and 18b are laminated. Thus, the characteristic impedance of the high-frequency signal line 10 is inhibited from deviating from a predetermined value, and further, the electrical characteristics of the high-frequency signal line 10 are also inhibited from being affected by variations in capacitance and inductance.

Furthermore, in the method for producing the high-frequency signal line 10, either one of the signal line 20 and the auxiliary ground conductor 24, whichever has been formed first, is used as a positioning marker for forming the other. Therefore, it is possible to form the signal line 20 and the auxiliary ground conductor 24 in the accurate positions. Thus, it is possible to inhibit a deviation in the positional relationship between the signal line 20 and the openings 30 of the auxiliary ground conductor 24 in the high-frequency signal line 10.

Furthermore, in the case of the high-frequency signal line 10 and the production method therefor, only the dielectric sheet 18b is present between the signal line 20 and the auxiliary ground conductor 24. Accordingly, when the dielectric element assembly 12 is subjected to pressure bonding, only the dielectric sheet 18b is deformed between the signal line 20 and the auxiliary ground conductor 24. Therefore, the distance between the signal line 20 and the auxiliary ground conductor 24 is prevented from being shortened at the time of pressure bonding. Thus, it is possible to inhibit a deviation in the positional relationship between the signal line 20 and the openings 30 of the auxiliary ground conductor 24 in the high-frequency signal line 10.

Furthermore, the high-frequency signal line 10 is capable of being easily bent because the openings 30 are provided in the auxiliary ground conductor 24.

Furthermore, since misalignment among layers is prevented, the difference between the width of the opening 30 in the y-axis direction and the width of the signal line 20 can be designed so as to be small. As a result, high-frequency signal radiation from the signal line 20 is shielded effectively by the auxiliary ground conductor 24. Thus, it is possible to achieve a high-frequency signal line with little spurious radiation.

Furthermore, in the high-frequency signal line 10, the characteristic impedance of the signal line 20 is inhibited from deviating from a predetermined value (e.g., about 50Ω). More specifically, in the case of the flexible board described in Japanese Patent Laid-Open Publication No. 2007-123740, an electromagnetic field might leak out of the flexible board from the opening. Accordingly, if there is a dielectric, metal, or the like provided around the flexible board, electromagnetic field coupling occurs between the signal line of the flexible board and the dielectric, metal, or the like. As a result, the characteristic impedance of the signal line in the flexible board might deviate from a predetermined value.

On the other hand, in the high-frequency signal line 10, the top surface of the dielectric element assembly 12, which is positioned on the side of the reference ground conductor 22 relative to the signal line 20, is in contact with the battery pack 206. That is, the reference ground conductor 22 essentially having no openings, rather than the auxiliary ground conductor 24 having the openings 30, is positioned between the signal line 20 and the battery pack 206. Therefore, it is possible to inhibit occurrence of electromagnetic field coupling between the signal line 20 and the battery pack 206. Thus, in the high-frequency signal line 10, the characteristic impedance of the signal line 20 is prevented from deviating from a predetermined value.

Furthermore, the high-frequency signal line 10 is capable of being easily bent also for the reasons given below. The characteristic impedance Z of the high-frequency signal line 10 is represented by $\sqrt{(L/C)}$, where L is an inductance value per unit length of the high-frequency signal line 10, and C is a capacitance value per unit length of the high-frequency signal line 10. The high-frequency signal line 10 is designed such that Z takes a predetermined characteristic impedance value (e.g., about 50Ω).

Here, to allow the high-frequency signal line 10 to be easily bendable, it is conceivable to reduce the thickness of the high-frequency signal line 10 in the z-axis direction (simply referred to below as the thickness of the high-frequency signal line 10). However, reducing the thickness of the high-frequency signal line 10 results in a shorter distance between the signal line 20 and each of the reference ground conductor 22 and the auxiliary ground conductor 24, hence an increased capacitance value C. As a result, the characteristic impedance Z becomes less than the predetermined characteristic impedance value.

Therefore, the width of the signal line 20 in the y-axis direction (simply referred to below as the width of the signal line 20) is conceivably narrowed to increase the inductance value L of the signal line 20 and reduce the opposed area of the signal line 20 and each of the reference ground conductor 22 and the auxiliary ground conductor 24, thus reducing the capacitance value C.

However, it is difficult to form a narrow signal line 20 with high accuracy.

Therefore, in the high-frequency signal line 10, the openings 30 are provided in the auxiliary ground conductor 24. As a result, the opposed area of the signal line 20 and the auxiliary ground conductor 24 is reduced, resulting in a smaller capacitance value C. Thus, it is possible to render the high-frequency signal line 10 easily bendable while maintaining the characteristic impedance Z at a predetermined value.

Furthermore, in the high-frequency signal line 10, the auxiliary ground conductor 24 is covered by the protective layer 15. Accordingly, the auxiliary ground conductor 24 is not exposed from the bottom surface of the high-frequency signal line 10. Therefore, even if another component is disposed on the bottom surface of the high-frequency signal line 10, the auxiliary ground conductor 24 is not directly opposed to that component, so that the characteristic impedance of the signal line 20 is inhibited from fluctuating.

Furthermore, the ratio of T2 to T1 preferably is set in the range from about 1:2 to about 1:7, for example, so that the transmission loss of a high-frequency signal is significantly reduced, minimized or prevented. More specifically, when the ratio of T2 to T1 is 1:1.5, the distance between the signal line 20 and the reference ground conductor 22 becomes excessively close. Accordingly, to keep the characteristic impedance of the signal line 20 at about 50Ω, it is necessary to narrow the signal line 20. However, this increases the transmission loss of a high-frequency signal. On the other hand, when the ratio of T2 to T1 is about 1:10, the distance between the bridge portion 60 and the signal line 20 becomes excessively close. Accordingly, it is necessary to widen the bridge portion 60. However, this also increases the transmission loss of a high-frequency signal. Therefore, the ratio of T2 to T1 is preferably set in the range from about 1:2 to about 1:7, for example.

Note that at the time of designing the high-frequency signal line 10, the distance between the signal line 20 and the reference ground conductor 22 is determined such that the characteristic impedance of the signal line 20 is higher than a predetermined value (e.g., about 50Ω) in a state where the reference ground conductor 22 is present but there is no auxiliary ground conductor 24. Further, the shape of the opening 30 in the auxiliary ground conductor 24 and the distance between the signal line 20 and the auxiliary ground conductor 24 are determined such that the characteristic impedance of the signal line 20 is equal to the predetermined characteristic impedance (e.g., about 50Ω) in a state where the auxiliary ground conductor 24 is added.

The signal line 20 is provided on the top surface of the dielectric sheet 18b, and the auxiliary ground conductor 24 is provided on the bottom surface of the dielectric sheet 18b. In general, conductors are more resistant to elongation than the dielectric sheet 18b, and therefore, providing more conductors on the dielectric sheet 18b significantly reduce, minimize or prevent elongation of the dielectric sheet 18b more effectively. Accordingly, elongation of the dielectric sheet 18b during production of the high-frequency signal line 10 is less than elongation of a dielectric sheet during production of a high-frequency signal line with only a signal line provided on the dielectric sheet. Thus, it is possible to inhibit the signal line 20 from being broken by the dielectric sheet 18b being stretched and elongated significantly during production.

First Modification

Figure 8:
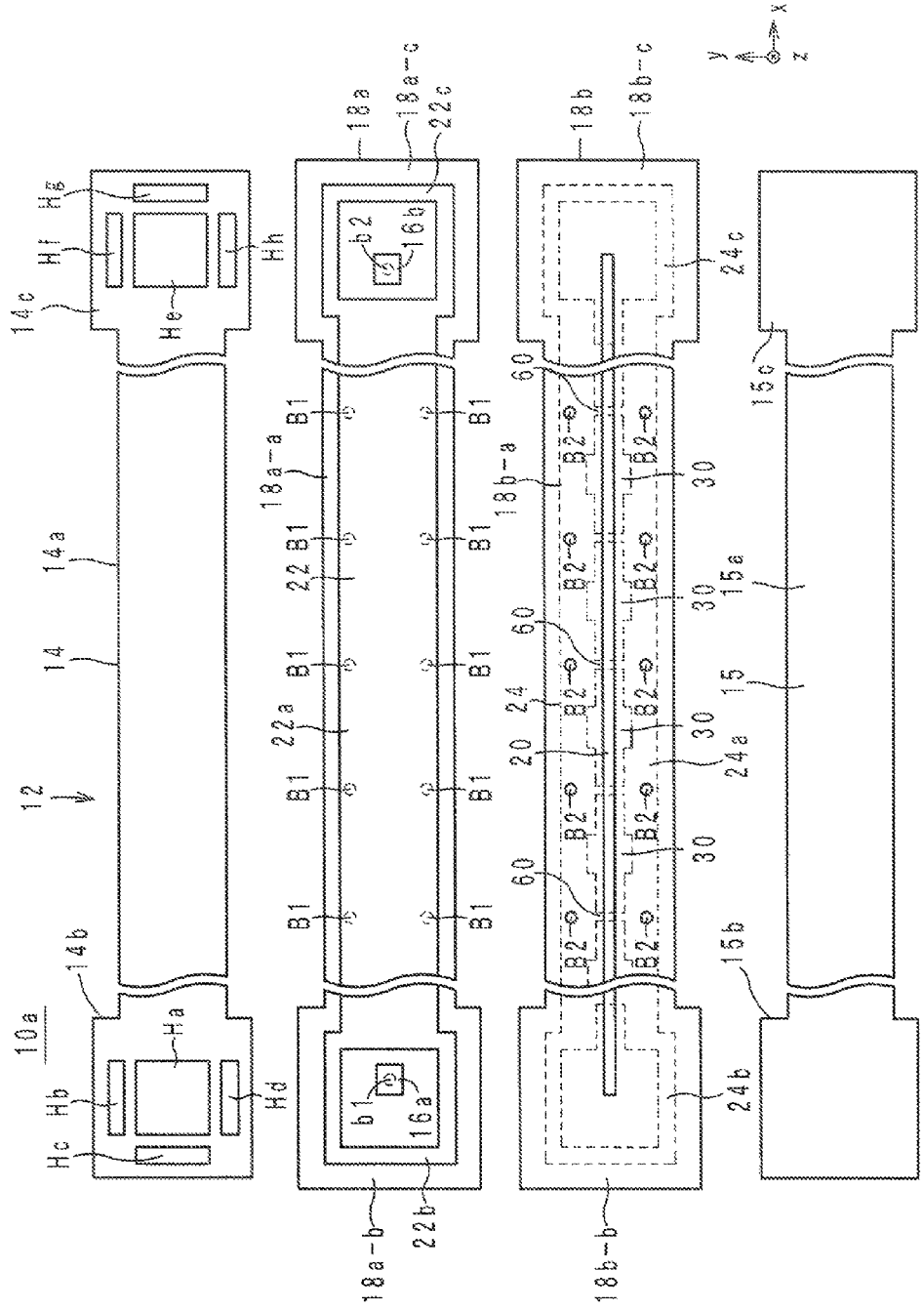
FIG. 8 is an exploded view of a laminate of a high-frequency signal line according to a first modification of a preferred embodiment of the present invention.
Figure 9:
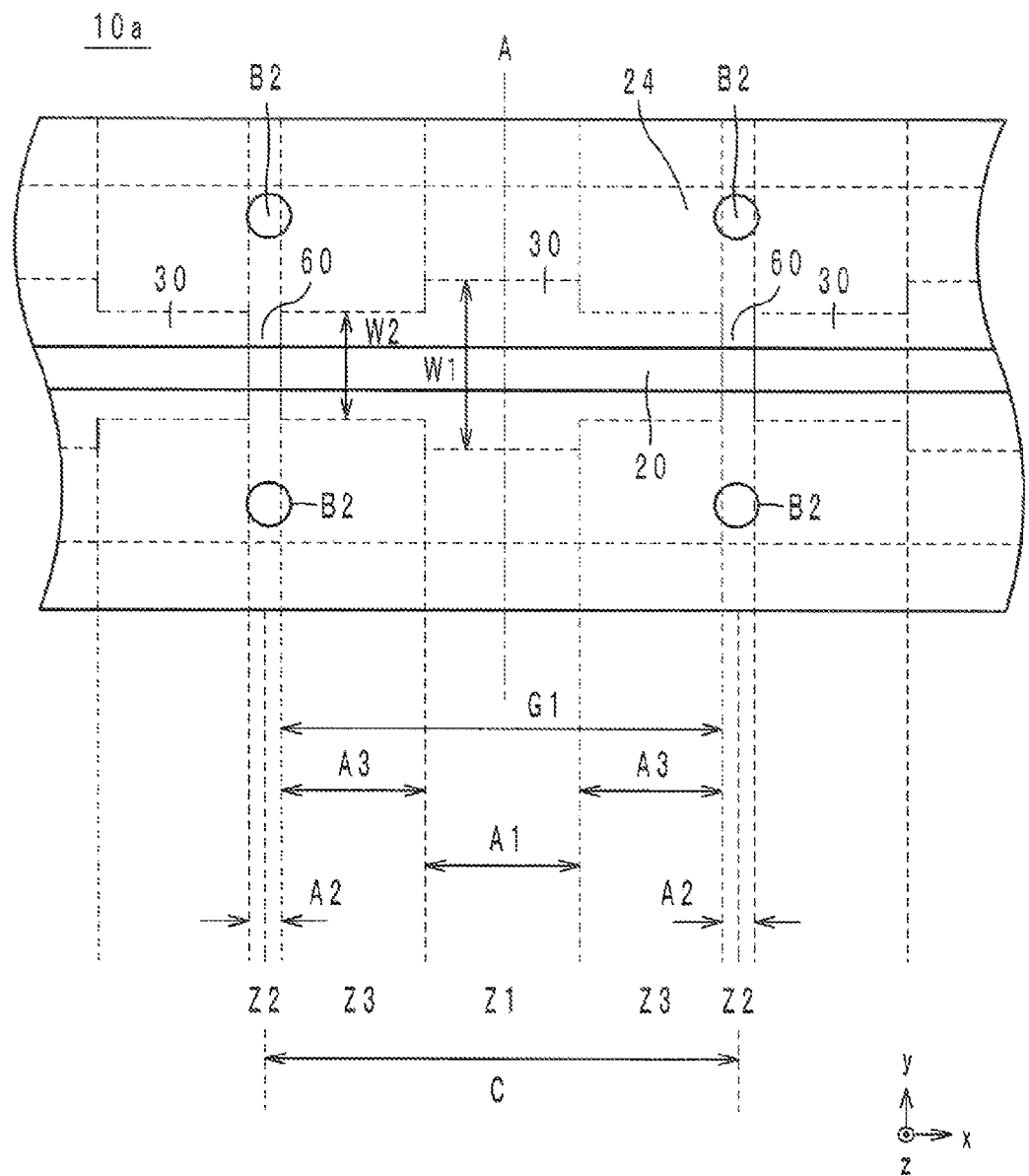
FIG. 9 is a perspective view of the high-frequency signal line in FIG. 8 as seen in the z-axis direction.

The configuration of a high-frequency signal line according to a first modification of a preferred embodiment of the present invention will be described below with reference to the drawings. FIG. 8 is an exploded view of a laminate 12 of the high-frequency signal line 10a according to the first modification. FIG. 9 is a perspective view of the high-frequency signal line 10a in FIG. 8 as seen in the z-axis direction. FIG. 10 is an equivalent circuit diagram of a portion of the high-frequency signal line 10a according to the first modification.

The high-frequency signal line 10a differs from the high-frequency signal line 10 in terms of the shape of the opening 30. The configuration of the high-frequency signal line 10a will be described below mainly focusing on the difference. Note that as in the first preferred embodiment, the width of the signal line 20 preferably is about 300 µm, for example.

The auxiliary ground conductor 24 preferably has a ladder-shaped configuration in which a plurality of openings 30 and a plurality of bridge portions 60 alternate with each other along the signal line 20. The openings 30 overlap with the signal line 20 when viewed in a plan view in the z-axis direction, as shown in FIG. 9, and have a shape that is line-symmetric with respect to the signal line 20. That is, the signal line 20 crosses the center of the openings 30 in the y-axis direction.

Further, the shape of the opening 30 is also line-symmetric with respect to line A perpendicularly crossing the signal line 20 (i.e., extending in the y-axis direction) so as to pass through the center of the opening 30 in the direction (x-axis direction) in which the signal line 20 extends. More details will be given below.

A region including the center of the opening 30 in the x-axis direction is defined as a region A1. Also, a region corresponding to the bridge portion 60 is defined as a region A2. Further, a region between the regions A1 and A2 is defined as a region A3. There are regions A3 positioned next to the region A1 on opposite sides in the x-axis direction, such that each region A3 neighbors both of the regions A1 and A2. The dimension of the region A2 in the x-axis direction (i.e., the width of the bridge portion 60) preferably is, for example, from about 25 µm to about 200 µm. In the present preferred embodiment, the dimension of the region A2 in the x-axis direction preferably is about 100 µm, for example.

Line A passes through the center of the region A1 in the x-axis direction, as shown in FIG. 9. Moreover, the width W1 of the opening 30 in the direction (y-axis direction) perpendicular to the signal line 20 in the region A1 is greater than the width W2 of the opening 30 in the y-axis direction in the region A3. That is, the opening 30 is shaped so as to be the widest near the center in the x-axis direction and line-symmetric with respect to line A. The region of the opening 30 that has the width W1 in the y-axis direction is the region A1, and the region that has the width W2 in the y-axis direction is the region A3. Accordingly, the opening 30 is stepped at the boundary between the regions A1 and A3. The width W1 preferably is, for example, from about 500 µm to about 1500 µm. In the present preferred embodiment, the width W1 preferably is about 900 µm, for example. Also, the width W2 preferably is, for example, from about 250 µm to about 750 µm, for example. In the present preferred embodiment, the width W2 preferably is about 400 µm, for example.

Furthermore, the length G1 of the opening 30 in the x-axis direction preferably is, for example, from about 1 mm to about 5 mm. In the present preferred embodiment, the length G1 preferably is about 3 mm, for example. Here, the length G1 is greater than the width W1, which is the greatest width of the opening 30. Moreover, the length G1 is preferably about two times or more of the width W1.

Furthermore, the auxiliary ground conductor 24 has no aperture between adjacent openings 30. More specifically, a conductor layer (bridge portion 60) uniformly stretches across the whole region A2 between adjacent openings 30, hence no aperture between the adjacent openings 30.

In the high-frequency signal line 10a thus configured, the characteristic impedance of the signal line 20 between two adjacent bridge portions 60 increases in the order: minimum value Z2, intermediate value Z3, and maximum value Z1, in the direction from one of the bridge portions 60 toward the other, and thereafter, decreases in the order: maximum value Z1, intermediate value Z3, and minimum value Z2. More specifically, the opening 30 has the width W1 in the region A1, and also has the width W2 in the region A3, which is less than the width W1. Accordingly, the distance between the signal line 20 and the auxiliary ground conductor 24 is greater in the region A1 than in the region A3. Therefore, the intensity of a magnetic field generated in the signal line 20 is higher in the region A1 than in the region A3, resulting in a higher inductance component in the region A1. That is, inductance (L) property is dominant in the region A1.

Furthermore, the bridge portion 60 is provided in the region A2. Accordingly, the distance between the signal line 20 and the auxiliary ground conductor 24 is greater in the region A3 than in the region A2. As a result, the capacitance generated in the signal line 20 is greater in the region A2 than in the region A3, and the intensity of a magnetic field is lower in the region A2 than in the region A3. That is, capacitance (C) property is dominant in the region A2.

In this manner, the characteristic impedance of the signal line 20 is at the maximum value Z1 in the region A1. That is, the opening 30 has the width W1 where the characteristic impedance of the signal line 20 is at the maximum value Z1. Further, the characteristic impedance of the signal line 20 is at the intermediate value Z3 in the region A3. That is, the opening 30 has the width W2 where the characteristic impedance of the signal line 20 is at the intermediate value Z3. Still further, the characteristic impedance of the signal line 20 is at the minimum value Z2 in the region A2.

In this manner, the high-frequency signal line 10 has a circuit configuration shown in FIG. 10. More specifically, there is essentially no capacitance created between the signal line 20 and the auxiliary ground conductor 24 in the region A1, and therefore, the characteristic impedance Z1 occurs mainly due to the inductance L1 of the signal line 20. Moreover, there is significant capacitance C3 created between the signal line 20 and the auxiliary ground conductor 24 in the region A2, and therefore, the characteristic impedance Z2 occurs mainly due to the capacitance C3. In addition, there is capacitance C2 lower than the capacitance C3, created between the signal line 20 and the auxiliary ground conductor 24 in the region A3, and therefore, the characteristic impedance Z3 occurs mainly due to the inductance L2 of the signal line 20 and the capacitance C2. Further, the characteristic impedance Z3 preferably is, for example, about 55Ω. The characteristic impedance Z1 preferably is, for example, about 70Ω, which is higher than the characteristic impedance Z3. The characteristic impedance Z2 preferably is, for example, about 30Ω, which is lower than the characteristic impedance Z3. Moreover, the characteristic impedance of the entire high-frequency signal line 10 preferably is about 50Ω, for example.

In the high-frequency signal line 10a, the characteristic impedance of the signal line 20 between two adjacent bridge portions 60 fluctuates so as to increase in the order: minimum value Z2, intermediate value Z3, and maximum value Z1, in the direction from one of the bridge portions 60 toward the other, and thereafter, decrease in the order: maximum value Z1, intermediate value Z3, and minimum value Z2. This renders it possible to make the high-frequency signal line 10a thinner, and yet possible to increase the width of an electrode of the signal line 20, so that the signal line 20, the reference ground conductor 22, and the auxiliary ground conductor 24 can be increased in surface area of an electrode to which a high-frequency current is applied, resulting in a reduced transmission loss of a high-frequency signal. Moreover, the length AL of a cycle (one region A1, two regions A2, and two regions A3), as shown in FIG. 9, is preferably from about 1 mm to about 5 mm, for example, which is sufficiently short to significantly reduce, minimize or prevent spurious radiation up to a higher frequency range and to further improve the transmission loss. In addition, the region A3 is provided at each end of the region A1, thus stabilizing the ground potential of the region A2 to prevent a strong magnetic field due to a current flowing through the signal line 20 from being transmitted directly to the region A2, so that the shielding effectiveness of the auxiliary ground conductor 24 is reliably maintained. Therefore, spurious radiation is inhibited from being generated. Thus, in the case of the high-frequency signal line 10a, even when the distance between the signal line 20 and each of the ground conductors 22 and 24 is reduced, it is possible to widen the signal line 20, so that the high-frequency signal line 10a with little transmission loss is made thinner with the characteristic impedance being maintained. Thus, the high-frequency signal line 10b is bent more easily and therefore is configured to be used in a curved state.

Furthermore, the high-frequency signal line 10a renders it possible to stabilize the ground potential of the auxiliary ground conductor 24, resulting in a reduced transmission loss, and further, enhanced shielding property. More specifically, in the high-frequency signal line 10a, the width W1 of the opening 30 in the region A1 is greater than the width W2 of the opening 30 in the region A3. Accordingly, in the high-frequency signal line 10a, the magnetic field energy of the signal line 20 is higher in the region A1 than in the region A3. Further, the magnetic field energy of the signal line 20 is lower in the region A2 than in the region A3. Accordingly, the characteristic impedance of the signal line 20 repeatedly fluctuates in the order: Z2, Z3, Z1, Z3, Z2 . . . . As a result, the magnetic field energy of the signal line 20 fluctuates gently between adjacent portions in the x-axis direction. Therefore, at the boundary between unit structures (regions A1 to A3), the magnetic field energy decreases, fluctuations of the ground potential of the ground conductor are significantly reduced, minimized or prevented, and occurrence of spurious radiation and transmission loss of a high-frequency signal is significantly reduced, minimized or prevented. In other words, the region A3 renders it possible to significantly reduce, minimize or prevent occurrence of any unnecessary inductance component in the bridge portion 60, thus reducing a mutual inductance component between the bridge portion 60 and the signal line 20, while stabilizing the ground potential. Thus, although the high-frequency signal line 10a is thin and has the relatively large openings 30 provided in the ground conductor, both spurious radiation and the transmission loss of a high-frequency signal are significantly reduced, minimized or prevented.

Furthermore, the via-hole conductors B1 and B2 are arranged in the direction in which the bridge portion 60 stretches, so that occurrence of any unnecessary inductance component in the bridge portion 60 are further significantly reduced, minimized or prevented. In particular, the length G1 of the opening 30 in the x-axis direction (i.e., the interval between the bridge portions 60) preferably is set greater than the width W1 of the opening 30 in the region A1, and therefore, it is rendered possible to significantly reduce, minimize or prevent occurrence of spurious radiation while achieving a predetermined characteristic impedance by increasing the size of the opening 30 as much as possible.

Furthermore, the openings 30 are unit structures cyclically arranged in the direction (x-axis direction) in which the signal line 20 extends. Therefore, the frequency dependence of the characteristic impedance of the signal line 20 in the opening 30 can be determined by the length of the opening 30 in the x-axis direction. More specifically, as the length G1 of the opening 30 decreases, the frequency dependence of the characteristic impedance of the signal line 20 can be expanded to a higher frequency range. In addition, as the length G1 of the opening 30 increases, it is possible to reduce the width W1 of the opening 30 in the region A1, thus narrowing the opening 30. Thus, spurious radiation is significantly reduced or prevented, thus significantly decreasing the transmission loss, so that the high-frequency signal line 10a has a stabilized impedance characteristic over a wide band.

Furthermore, also for the reasons given below, the high-frequency signal line 10a can be curved for use. The high-frequency signal line 10 is most deflectable in the region A1 because the width of the opening 30 in the y-axis direction is the largest. On the other hand, the high-frequency signal line 10 is least deflectable in the region A2 because there is no opening 30. Accordingly, in the case where the high-frequency signal line 10a is bent for use, it is bent in the region A1 and barely bent in the region A2. Therefore, in the high-frequency signal line 10a, the via-hole conductors B1 and B2, which are more resistant to deformation than the dielectric sheets 18, are provided in the region A2. Thus, the high-frequency signal line 10a is easily bent in the region A1.

Note that the predetermined characteristic impedance of the high-frequency signal line 10a is also obtainable by adjusting both the distance T1 between the signal line 20 and the reference ground conductor 22 and the distance T2 between the signal line 20 and the auxiliary ground conductor 24.

Furthermore, in the high-frequency signal line 10a, also for the reasons given below, the length G1 of the opening 30 in the direction in which the signal line 20 extends is greater than the width W1. More specifically, the high-frequency signal line 10 transmits a high-frequency signal in transverse electromagnetic (TEM) mode. In TEM mode, both electric and magnetic fields are created so as to be perpendicular or substantially perpendicular to the direction (x-axis direction) in which a high-frequency signal is transmitted. More specifically, the magnetic field is generated so as to circle around the signal line 20, and the electric field radiates from the signal line 20 toward the reference ground conductor 22 and the auxiliary ground conductor 24. Here, in the case where the openings 30 are provided in the reference ground conductor 22, because the magnetic field makes a circular motion, the magnetic field simply experiences a slight increase in radius in the openings 30 and does not expand as much as it leaks out of the high-frequency signal line 10a. On the other hand, the electric field radiates partially to the outside of the high-frequency signal line 10a. Accordingly, the electric field radiation contributes significantly to the spurious radiation from the high-frequency signal line 10a.

Here, since the electric field is perpendicular or substantially perpendicular to the high-frequency signal transmission direction (x-axis direction), the amount of electric field radiating from the opening 30 increases (i.e., spurious radiation increases) as the width W1 of the opening 30 in the y-axis direction increases. On the other hand, the characteristic impedance of the high-frequency signal line 10a becomes higher as the width W1 increases, but there is essentially no electric field at a distance three times the width of the signal line 20, away from the signal line 20 in the direction perpendicular or substantially perpendicular to the high-frequency signal transmission direction, and therefore, the characteristic impedance of the high-frequency signal line 10a cannot be further increased even by further increasing the width W1. Accordingly, considering the fact that spurious radiation increases as the width W1 increases, it is not preferable to increase the width W1 more than necessary. Moreover, when the width W1 reaches half or approximately half of the wavelength of a high-frequency signal, the high-frequency signal line 10a functions as a slot antenna to radiate electromagnetic waves, resulting in a further increase in spurious radiation.

On the other hand, as the length G1 of the opening 30 in the x-axis direction increases, the area of the signal line 20 that is opposed to the reference ground conductor 22 decreases, and therefore, the width of the signal line 20 is increased. This is advantageous in that the high-frequency resistance of the signal line 20 is reduced.

Furthermore, in the case where the length G1 is greater than the width W1, the high-frequency resistance of a counter current (eddy current) in the reference ground conductor 22 is reduced.

Based on the foregoing, the length G1 is preferably greater than the width W1, more preferably twice or more as large as the width W1. However, when the length G1 of the opening 30 in the x-axis direction is close to half of the wavelength of a high-frequency signal, the high-frequency signal line 10a defines and functions as a slot antenna to radiate electromagnetic waves from the openings 30, and therefore, it should be taken into consideration that the length G1 is sufficiently short for the wavelength.

Furthermore, in the high-frequency signal line 10a, the positional relationship between the signal line 20 and the openings 30 in the auxiliary ground conductor 24 is inhibited from deviating from a predetermined relationship. Accordingly, the signal line 20 is configured to be positioned precisely with respect to the openings 30 in the auxiliary ground conductor 24. Therefore, even if the width W3 of the opening 30 in FIG. 9 is reduced, it is less likely that the auxiliary ground conductor overlaps with the signal line 20, resulting in fewer fluctuations in inductance and floating capacitance. Thus, it is possible to significantly reduce, minimize or prevent deterioration of the electrical characteristics.

Second Modification

Figure 11:
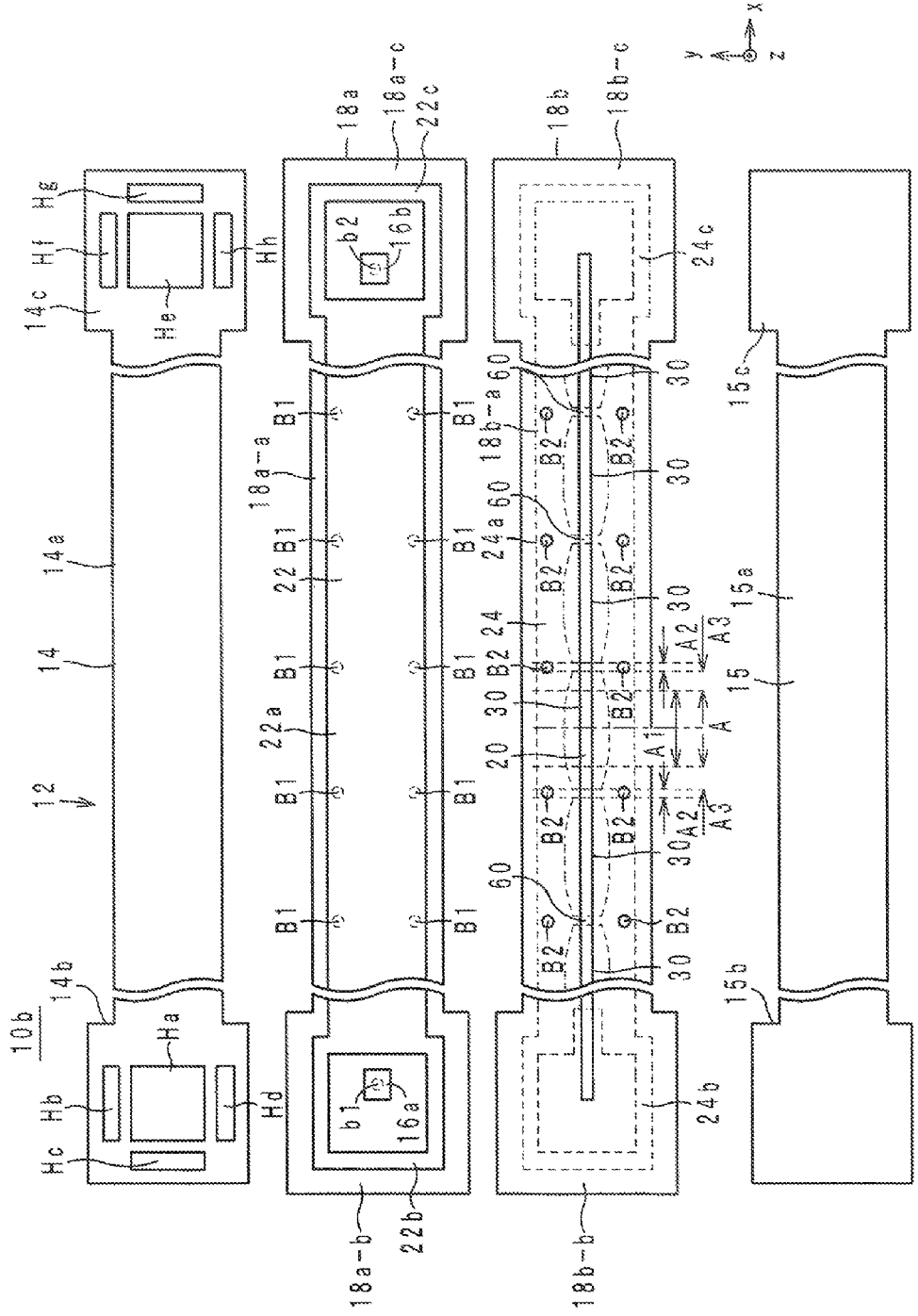
FIG. 11 is an exploded view of a laminate of a high-frequency signal line according to a second modification of a preferred embodiment of the present invention.

Hereinafter, a high-frequency signal line according to a second modification of a preferred embodiment of the present invention will be described with reference to the drawings. FIG. 11 is an exploded view of a laminate 12 of the high-frequency signal line 10b according to the second modification.

The high-frequency signal line 10b differs from the high-frequency signal line 10a in terms of the shape of the opening 30. More specifically, in the high-frequency signal line 10a, the width of the opening 30 in the y-axis direction changes stepwise and discontinuously, as shown in FIG. 8. On the other hand, in the high-frequency signal line 10b, the width of the opening 30 in the y-axis direction changes continuously. More specifically, the width of the opening 30 in the y-axis direction decreases continuously with the increasing distance from the center of the opening 30 in the x-axis direction. As a result, the magnetic field energy and the characteristic impedance of the signal line 20 change continuously.

Note that in the high-frequency signal line 10b, the region A1 is a region with the line A passing through its center, as shown in FIG. 11, which includes a portion of the opening 30 that has the width W1 in the y-axis direction. Accordingly, the characteristic impedance of the signal line 20 is at the maximum value Z1 in the region A1. Moreover, the region A2 is a region between openings 30, in which the bridge portion 60 is provided. Accordingly, the characteristic impedance of the signal line 20 is at the minimum value Z2 in the region A2. Furthermore, the region A3 is a region between the regions A1 and A2, which includes a portion of the opening 30 that has the width W2 in the y-axis direction. Accordingly, the characteristic impedance of the signal line 20 is at the intermediate value Z3 in the region A3.

Here, the region A1 is simply required to include the portion of the opening 30 that has the width W1 in the y-axis direction, and the region A3 is simply required to include the portion of the opening 30 that has the width W2 in the y-axis direction. Accordingly, in the present preferred embodiment, there is a boundary specifically defined between the regions A1 and A3. Therefore, an example of the boundary between the regions A1 and A3 is a position where a portion of the opening 30 has a width of about (W1+W2)/2 in the y-axis direction.

As with the high-frequency signal line 10, the high-frequency signal line 10b thus configured preferably is curved for use, and renders it possible to significantly reduce, minimize or prevent spurious radiation, and further, significantly reduce, minimize or prevent transmission loss in the signal line 20.

Third Modification

Figure 12:
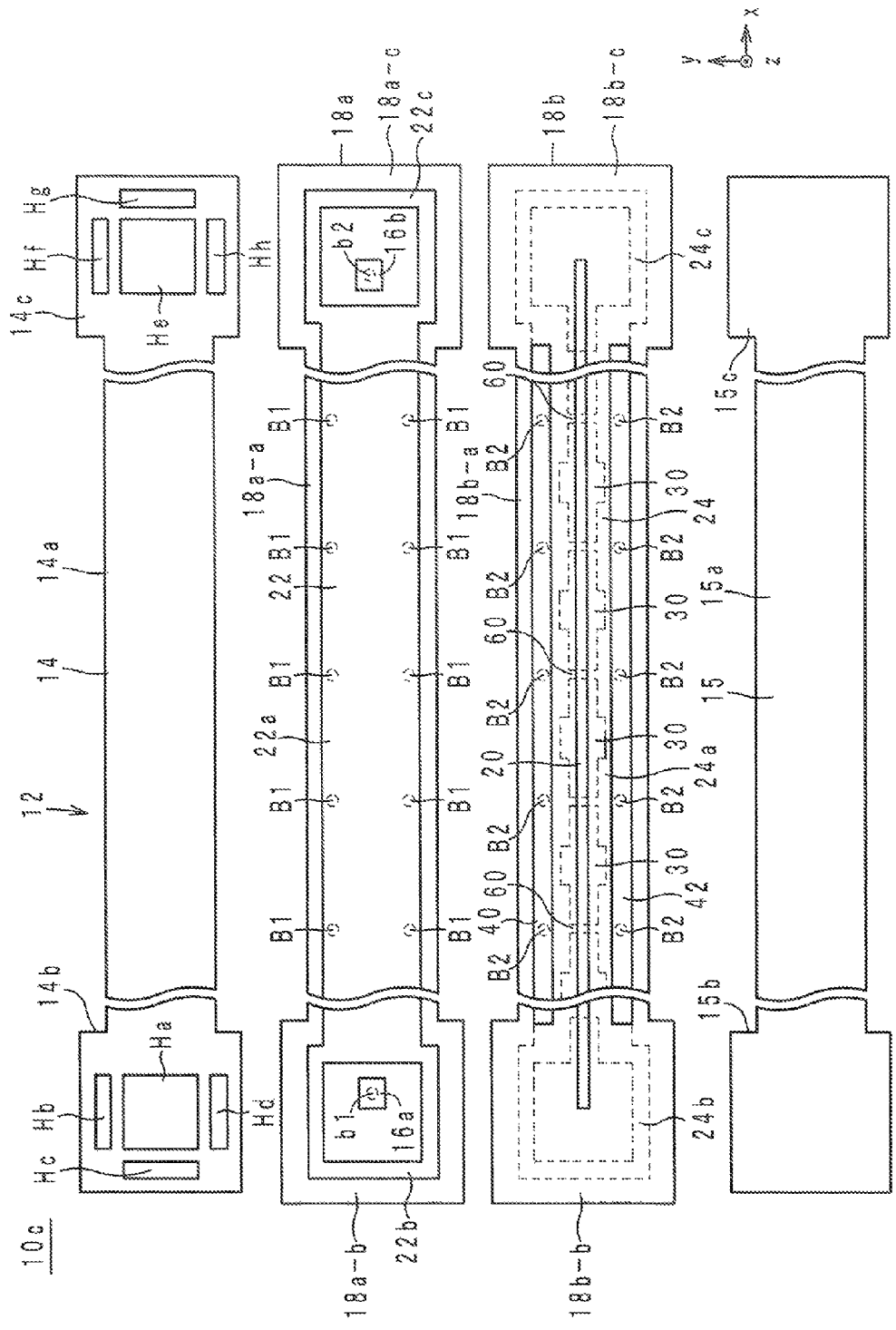
FIG. 12 is an exploded view of a laminate of a high-frequency signal line according to a third modification of a preferred embodiment of the present invention.

Hereinafter, a high-frequency signal line according to a third modification of a preferred embodiment of the present invention will be described with reference to the drawings. FIG. 12 is an exploded view of a laminate 12 of the high-frequency signal line 10c according to the third modification.

The high-frequency signal line 10c differs from the high-frequency signal line 10a in that ground conductors 40 and 42 are provided. More specifically, the high-frequency signal line 10c includes the ground conductors 40 and 42 provided on the top surface of the dielectric sheet 18b. The ground conductor preferably is a rectangular or substantially rectangular conductor positioned on the positive side in the y-axis direction relative to the signal line 20, so as to extend in the x-axis direction. The ground conductor 40 is connected to the reference ground conductor 22 and the auxiliary ground conductor 24 through the via-hole conductors B1 and B2. Moreover, the ground conductor 42 preferably is a rectangular or substantially rectangular conductor positioned on the negative side in the y-axis direction relative to the signal line 20, so as to extend in the x-axis direction. The ground conductor 42 is connected to the reference ground conductor 22 and the auxiliary ground conductor 24 through the via-hole conductors B1 and B2.

In the high-frequency signal line 10c as above, the ground conductors 40 and 42 are provided on both sides of the signal line 20 in the y-axis direction, so that spurious radiation is inhibited from leaking out of the signal line 20 toward both sides in the y-axis direction.

Fourth Modification

Figure 13:
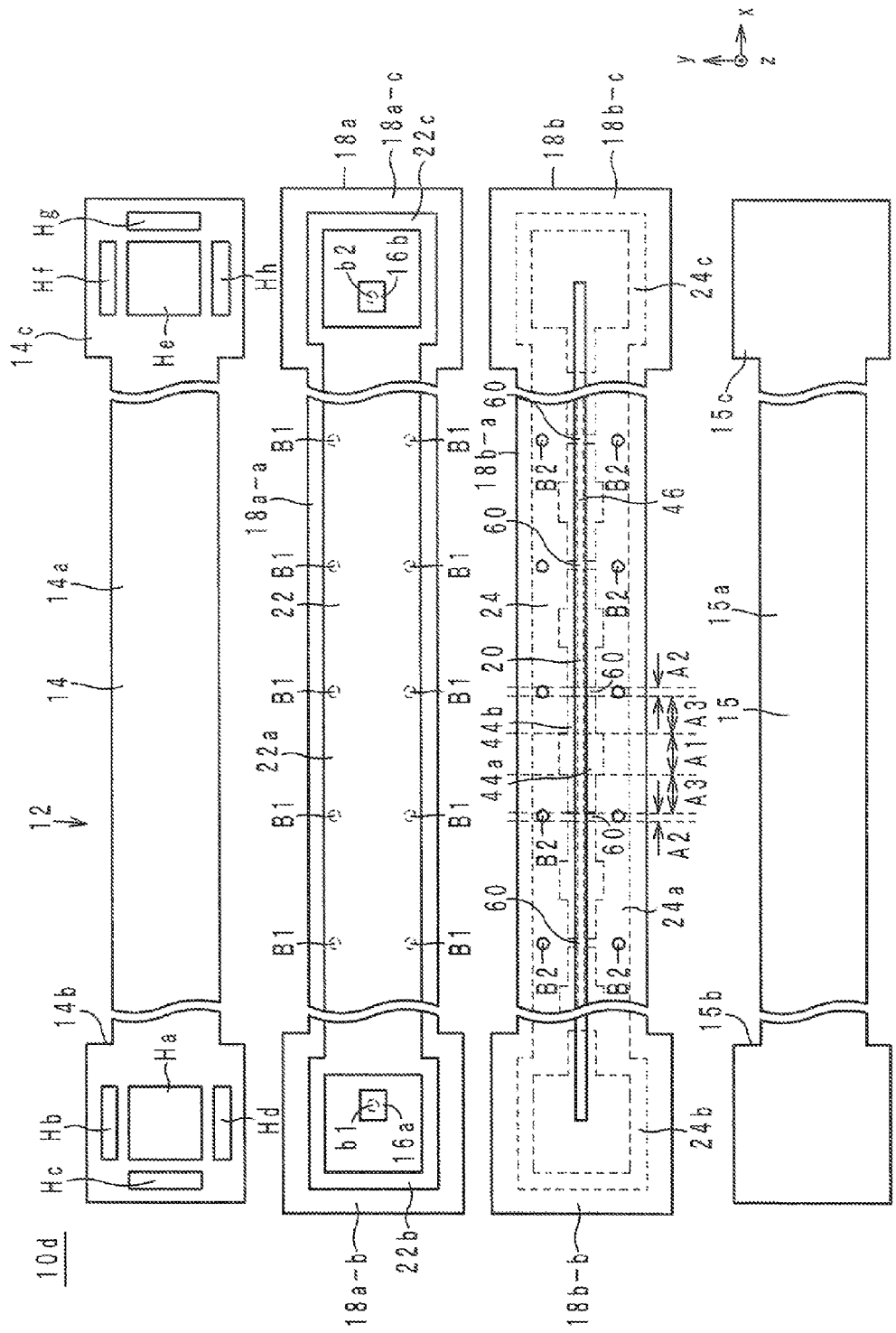
FIG. 13 is an exploded view of a laminate of a high-frequency signal line according to a fourth modification of a preferred embodiment of the present invention.

Hereinafter, a high-frequency signal line according to a fourth modification of a preferred embodiment of the present invention will be described with reference to the drawings. FIG. 13 is an exploded view of a laminate 12 of the high-frequency signal line 10d according to the fourth modification.

The high-frequency signal line 10d differs from the high-frequency signal line 10a in that openings 44a and 44b different in shape from the opening 30 are provided. More specifically, the openings 44a and 44b are in the shapes of the opening 30 being divided into two portions on the positive and negative sides in the y-axis direction. The high-frequency signal line 10d is provided with a linear conductor 46 extending between the openings 44a and 44b in the x-axis direction. The linear conductor 46 constitutes a portion of the auxiliary ground conductor 24, and overlaps with the signal line 20 when viewed in a plan view in the z-axis direction. The linear conductor 46 is narrower than the signal line 20. Accordingly, the signal line 20 protrudes from the linear conductor 46, and overlaps with the openings 44a and 44b.

In the high-frequency signal line 10d as above, both of the openings 44a and 44b are arranged along the signal line 20. As a result, the characteristic impedance of the signal line 20 is at the maximum value Z1 in the region A1. Further, the characteristic impedance of the signal line 20 is at the intermediate value Z3 in the region A3. Still further, the characteristic impedance of the signal line 20 is at the minimum value Z2 in the region A2.

Fifth Modification

Figure 14:
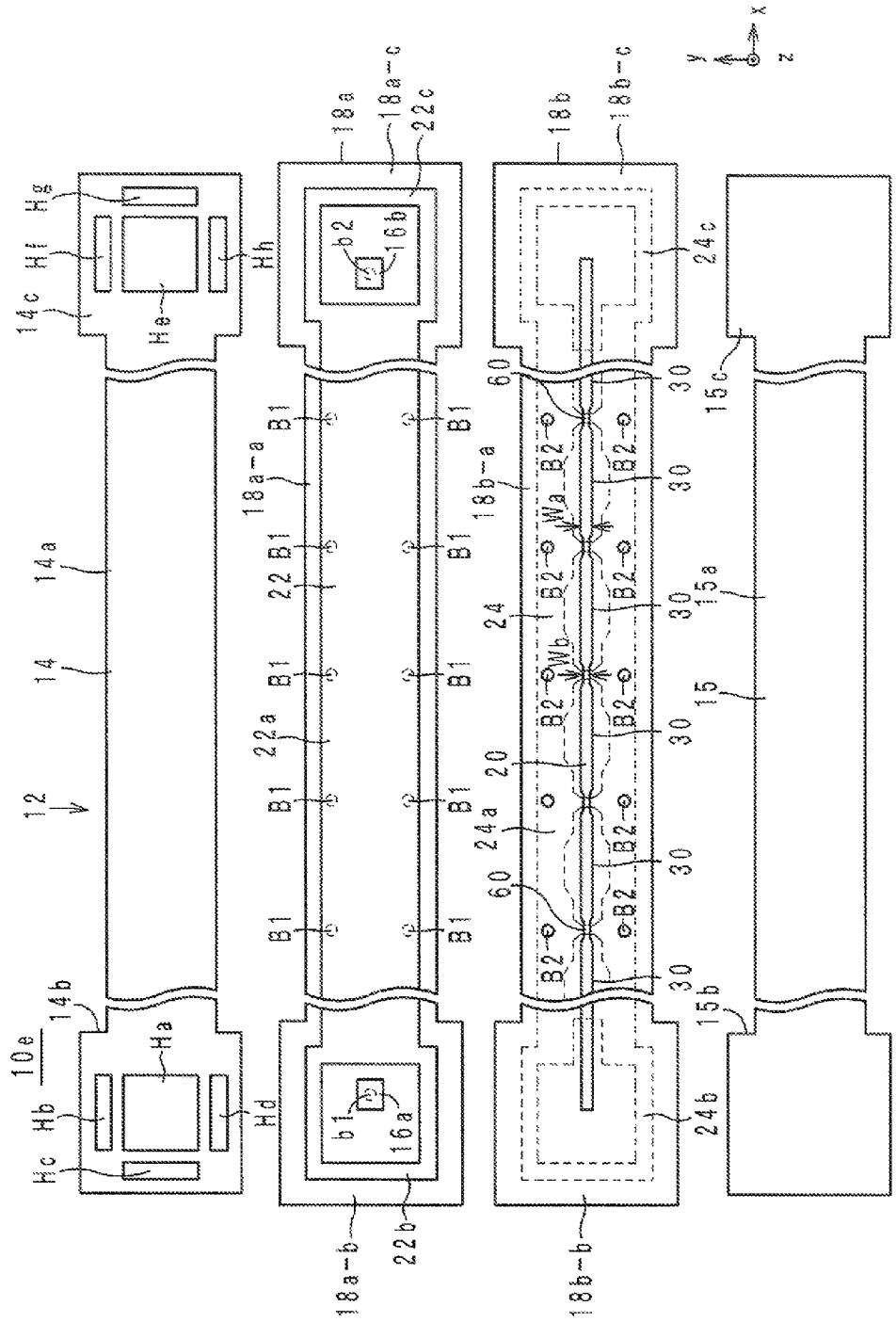
FIG. 14 is an exploded view of a laminate of a high-frequency signal line according to a fifth modification of a preferred embodiment of the present invention.

Hereinafter, a high-frequency signal line according to a fifth modification of a preferred embodiment of the present invention will be described with reference to the drawings. FIG. 14 is an exploded view of a laminate 12 of the high-frequency signal line 10e according to the fifth modification. FIG. 15 is a perspective view of the high-frequency signal line 10e in FIG. 14 as seen in the z-axis direction.

The high-frequency signal line 10e differs from the high-frequency signal line 10a in the following three features. The first difference is that the signal line 20 is narrower at the bridge portion 60 than at a portion where the characteristic impedance of the signal line 20 is at the maximum value Z1. The second difference is that the opening 30 is tapered between a position where the characteristic impedance of the signal line 20 is at the intermediate value Z3 (i.e., where the opening 30 has the width W2 in the y-axis direction) and a position where the characteristic impedance of the signal line 20 is at the maximum value Z1 (i.e., where the opening 30 has the width W1 in the y-axis direction). The third difference is that the opening 30 is tapered between a position where the characteristic impedance of the signal line 20 is at the intermediate value Z3 (i.e., where the opening 30 has the width W2 in the y-axis direction) and the bridge portion 60.

The definitions of the regions A1 to A3 in the high-frequency signal line 10e will now be described with reference to FIG. 15. The region A1 is a region where the opening 30 has the width W1 in the y-axis direction. The region A2 is a region corresponding to the bridge portion 60. The region A3 is a region between the regions A1 and A2, which includes a portion of the opening 30 that has the width W2 in the y-axis direction.

The first difference will be described. The signal line 20 has a width Wb in the region A2, as shown in FIGS. 14 and 15. On the other hand, the signal line 20 has a width Wa in the region A1, which is greater than the width Wb. The width Wa preferably is, for example, from about 100 μm to about 500 μm. In the present preferred embodiment, the width Wa preferably is about 350 μm, for example. The width Wb preferably is, for example, about 25 μm to about 250 μm. In the present preferred embodiment, the width Wb preferably is about 100 μm, for example. In this manner, the signal line 20 is narrower in the region A2 than in the region A1, so that the area where the signal line 20 overlaps with the bridge portion 60 decreases. As a result, floating capacitance created between the signal line 20 and the bridge portion 60 is reduced. Moreover, the signal line 20 has the width Wa where it overlaps with the opening 30, and therefore, an increase in the inductance value of the signal line 20 is significantly reduced, minimized or prevented in the overlapping portion. In addition, the signal line 20 preferably is narrowed partially, rather than completely, so that an increase in the resistance value of the signal line 20 is significantly reduced, minimized or prevented.

Furthermore, the signal line 20 is tapered where its width changes. As a result, the resistance value fluctuates gently where the width of the signal line 20 changes, so that a high-frequency signal is inhibited from being reflected where the width of the signal line 20 changes.

The second difference will be described. The opening 30 is tapered between the position where the opening 30 has the width W2 in the y-axis direction and the position where the opening 30 has the width W1 in the y-axis direction. Specifically, the region A3 is tapered at the end in the x-axis direction. As a result, loss of the current that flows through the auxiliary ground conductor 24 is reduced.

The third difference will be described. The opening 30 is tapered between the position where the opening 30 has the width W2 in the y-axis direction and the bridge portion 60. As a result, the bridge portion 60 is tapered at opposite ends in the y-axis direction. Accordingly, the width of the bridge portion 60 in the x-axis direction is narrower in a portion where it overlaps with the signal line 20 than in the rest of the bridge portion 60. Therefore, floating capacitance created between the bridge portion 60 and the signal line 20 is reduced. In addition, the bridge portion 60 preferably is narrowed partially, rather than completely, so that an increase in each of the resistance value and the inductance value of the bridge portion 60 is significantly reduced, minimized or prevented.

Sixth Modification

Figure 16:
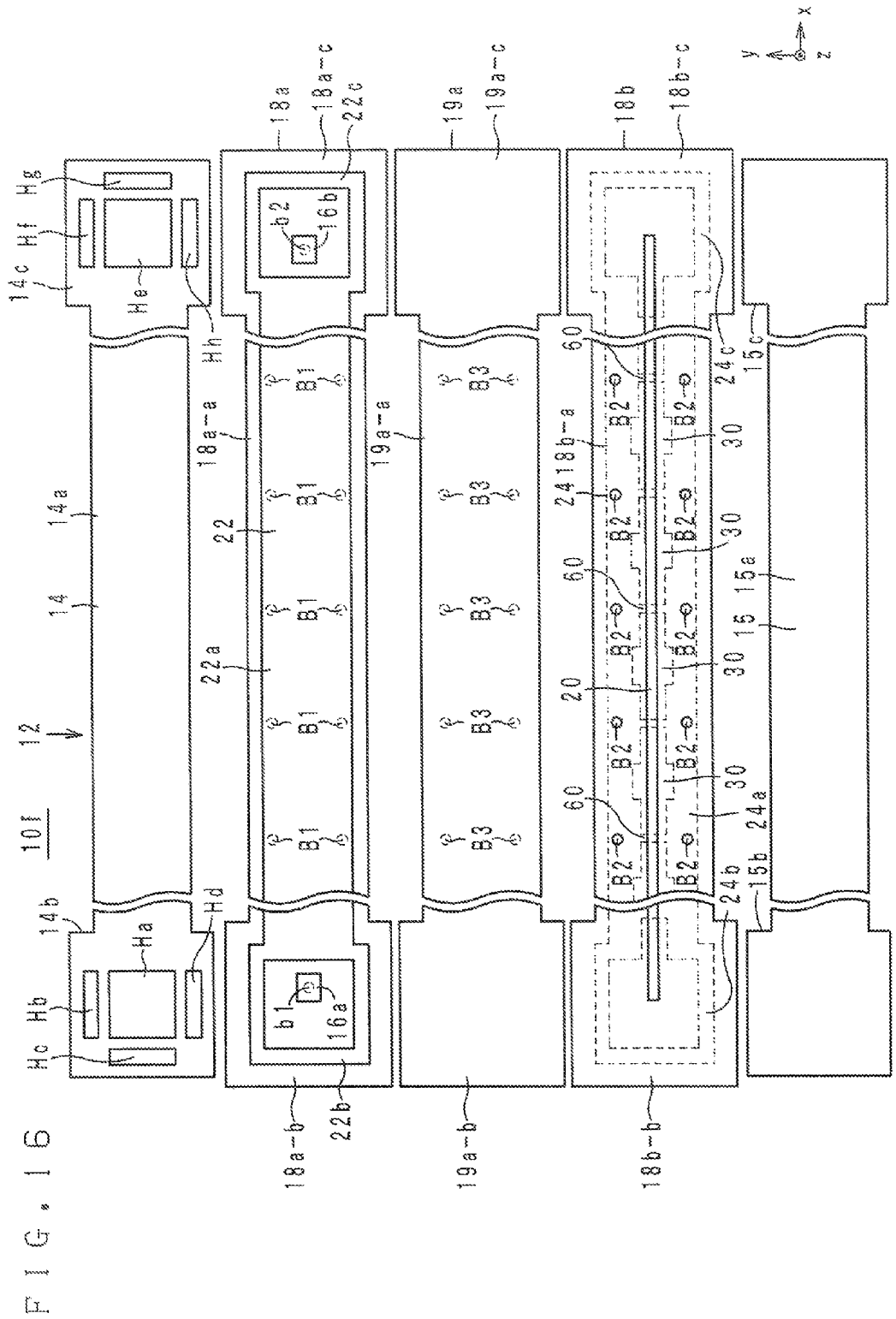
FIG. 16 is an exploded view of a laminate of a high-frequency signal line according to a sixth modification of a preferred embodiment of the present invention.

Hereinafter, a high-frequency signal line according to a sixth modification of a preferred embodiment of the present invention will be described with reference to the drawings. FIG. 16 is an exploded view of a laminate 12 of the high-frequency signal line 10f according to the sixth modification.

The high-frequency signal line 10f differs from the high-frequency signal line 10a in that the dielectric sheets 18a and 18b are bonded by an insulating adhesive layer 19a. More specifically, in the high-frequency signal line 10a, the dielectric sheets 18a and 18b are bonded by thermocompression bonding. On the other hand, in the high-frequency signal line 10f, the dielectric sheets 18a and 18b are bonded by the adhesive layer 19a. As the adhesive layer 19a, a vinyl acetate, fluorine, or acrylic adhesive may preferably be used, for example.

The adhesive layer 19a preferably has the same or substantially the same shape as the dielectric sheets 18a and 18b, and is positioned between the dielectric sheets 18a and 18b. Further, the adhesive layer 19a is provided with a plurality of via-hole conductors B3. The via-hole conductors B3 connect the via-hole conductors B1 and B2.

As with the high-frequency signal line 10, the high-frequency signal line 10*f* thus configured renders it possible to inhibit deviation of the predetermined desired positional relationship between the signal line 20 and the openings 30 in the auxiliary ground conductor 24.

Incidentally, in the method for producing the high-frequency signal line 10*f*, the via-hole conductors B1 to B3 are preferably formed in a single process, for example. More specifically, after the dielectric sheet 18*a*, the adhesive layer 19*a*, and the dielectric sheet 18*b* are stacked, via-holes are provided by irradiating the stack with laser beams where via-hole conductors B1 to B3 are to be formed. Thereafter, the via-holes are filled with a conductive paste, thus forming the via-hole conductors B1 to B3.

Alternatively, the dielectric sheet 18*a* with the adhesive layer 19*a* attached to the bottom surface may be irradiated with laser beams where via-hole conductors B1 and B3 are to be formed, thus providing via-holes, which are filled with a conductive paste so that the via-hole conductors B1 and B3 are formed.

The high-frequency signal line 10*f* can be easily produced by a method as will be described below. Specifically, the dielectric element assembly 12 of the high-frequency signal line 10*f* can be formed by performing a punching process on two rolls of large-sized dielectric sheets to serve as dielectric sheets 18*a* and 18*b*, after attaching the sheets by roll-to-roll processing and providing via-holes B1 to B3 in the sheets. Accordingly, it is not necessary to perform thermocompression bonding on a plurality of dielectric sheets 18, so that the high-frequency signal line 10*f* is easily produced.

Seventh Modification

Hereinafter, a high-frequency signal line according to a seventh modification of a preferred embodiment of the present invention will be described with reference to the drawings. FIG. 17 is an exploded view of a laminate 12 of the high-frequency signal line 10*g* according to the seventh modification.

The high-frequency signal line 10*g* differs from the high-frequency signal line 10*f* in that dielectric sheets 18*c* and 18*d* and adhesive layers 19*b* and 19*c* are provided. More specifically, the dielectric sheet 18*c* is stacked on the positive side in the z-axis direction relative to the dielectric sheet 18*a*. The adhesive layer 19*b* bonds the dielectric sheets 18*a* and 18*c*. Moreover, the dielectric sheet 18*d* is stacked on the negative side in the z-axis direction relative to the dielectric sheet 18*b*. The adhesive layer 19*c* bonds the dielectric sheets 18*b* and 18*c*.

As with the high-frequency signal line 10, the high-frequency signal line 10*g* thus configured renders it possible to inhibit the positional relationship between the signal line 20 and the openings 30 in the auxiliary ground conductor 24 from deviating from a predetermined relationship.

Note that in the high-frequency signal line 10*g*, the dielectric sheets 18*a* to 18*d* may be bonded by thermocompression bonding without using the adhesive layers 19*a* to 19*c*.

Eighth Modification

Figure 18:
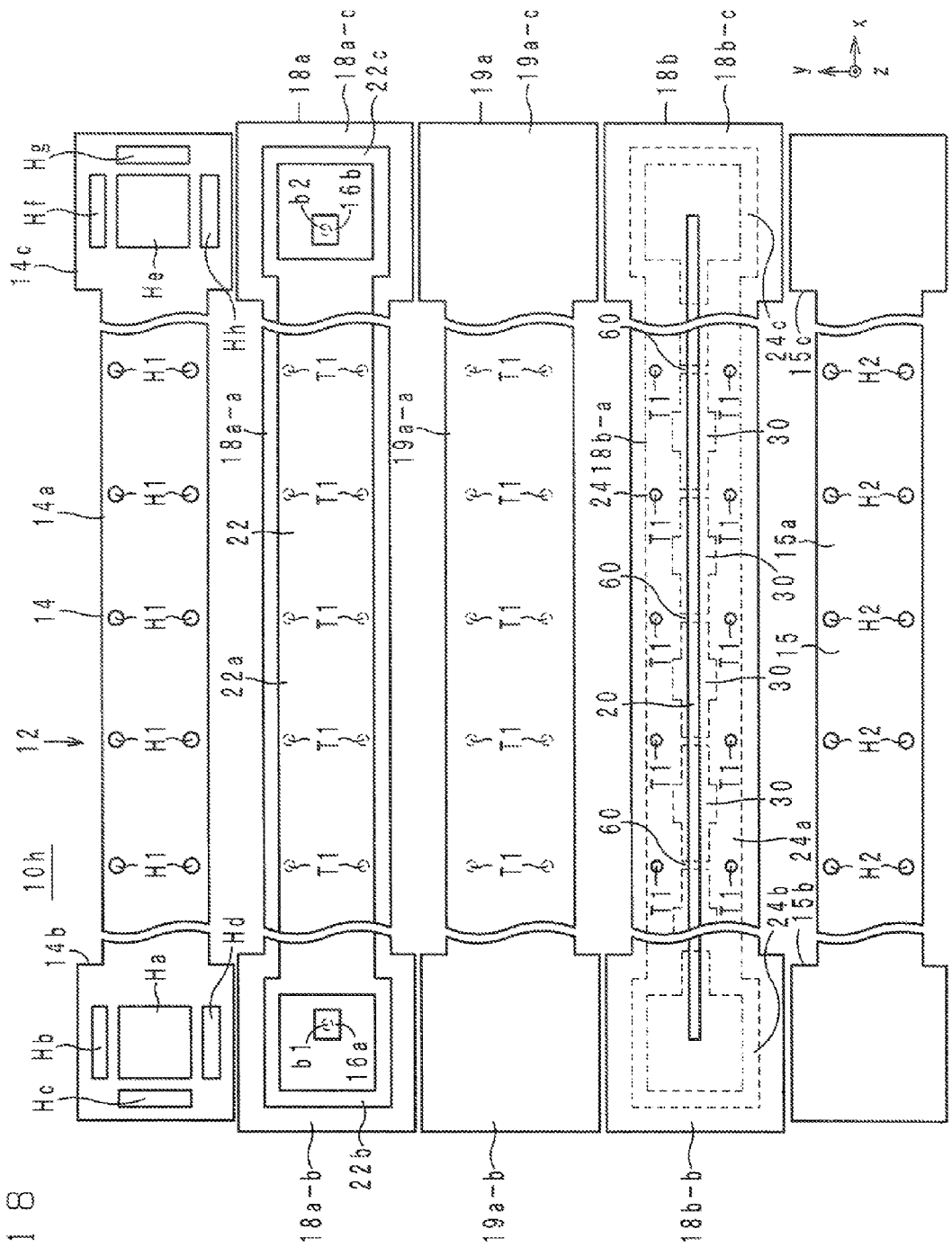
FIG. 18 is an exploded view of a laminate of a high-frequency signal line according to an eighth modification of a preferred embodiment of the present invention.
Figure 19:
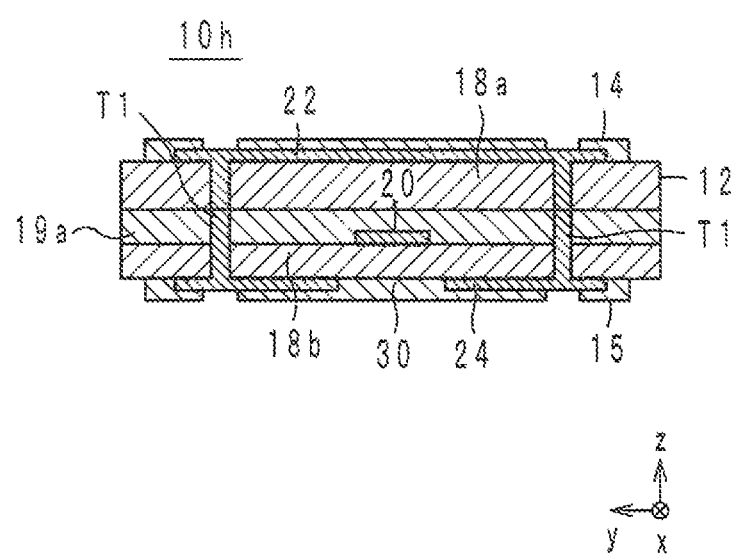
FIG. 19 is a cross-sectional structure view of the high-frequency signal line according to the eighth modification of a preferred embodiment of the present invention.

Hereinafter, a high-frequency signal line according to an eighth modification of a preferred embodiment of the present invention will be described with reference to the drawings. FIG. 18 is an exploded view of a laminate 12 of the high-frequency signal line 10*h* according to the eighth modification. FIG. 19 is a cross-sectional structure view of the high-frequency signal line 10*h* according to the eighth modification.

The high-frequency signal line 10*h* differs from the high-frequency signal line 10*g* in that the reference ground conductor 22 and the auxiliary ground conductor 24 are connected via through-hole conductors T1. More specifically, in the high-frequency signal line 10*g*, the reference ground conductor 22 and the auxiliary ground conductor 24 are connected by the via-hole conductors B1 to B3. On the other hand, in the high-frequency signal line 10*h*, the reference ground conductor 22 and the auxiliary ground conductor 24 are connected via the through-hole conductors T1, as shown in FIGS. 18 and 19. The through-hole conductors T1 are provided by filling through-holes, which pierce through the dielectric sheet 18*a*, the adhesive layer 19*a*, and the dielectric sheet 18*b* in the z-axis direction, with metal materials by Ni/Au plating.

Furthermore, the protective layer 14 has openings H1 provided in positions to overlap with the through-hole conductors T1. The protective layer 15 includes openings H2 provided in positions to overlap with the through-hole conductors T1.

In the high-frequency signal line 10*h*, the resistance of a high-frequency signal decreases. More specifically, a high-frequency signal flows at the top surface of the signal line 20 because of the skin effect. Moreover, the area of the signal line 20 that is opposed to the reference ground conductor 22 is smaller than the area of the signal line 20 that is opposed to the auxiliary ground conductor 24. Accordingly, the high-frequency signal flows through the signal line 20, mainly near the positive side in the z-axis direction.

Here, the signal line 20 is positioned on the top surface of the dielectric sheet 18*b*, as shown in FIG. 19. Accordingly, the signal line 20 is rougher on the side that contacts the dielectric sheet 18*b* (i.e., on the negative side in the z-axis direction) than on the side that does not contact the dielectric sheet 18*b* (i.e., on the positive side in the z-axis direction). That is, the surface of the signal line 20 that is opposed to the reference ground conductor 22 has lower surface roughness. Therefore, a high-frequency signal tends to flow at the surface of the signal line 20 that is opposed to the reference ground conductor 22.

Figure 20A:
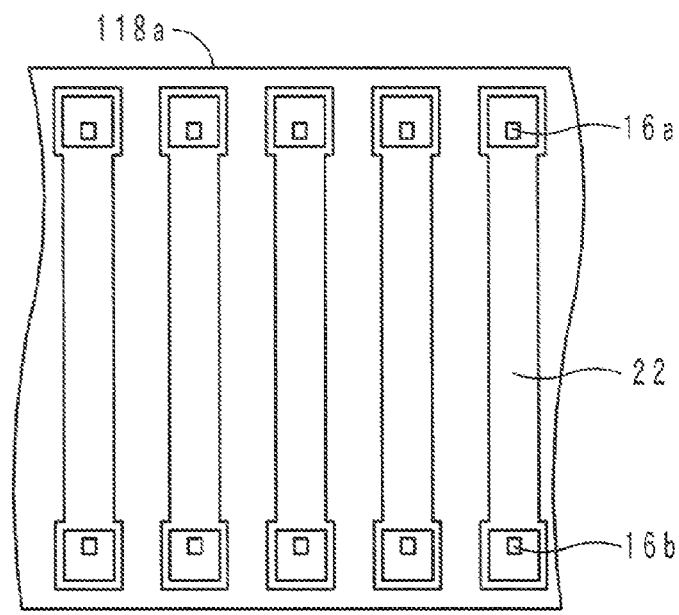
FIGS. 20A and 20B are diagrams illustrating mother sheets.
Figure 20B:
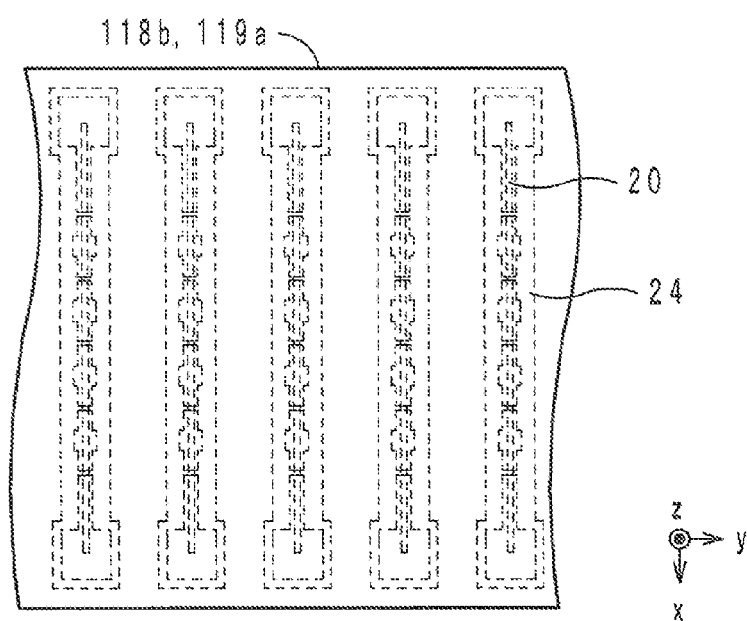
Figure 21:
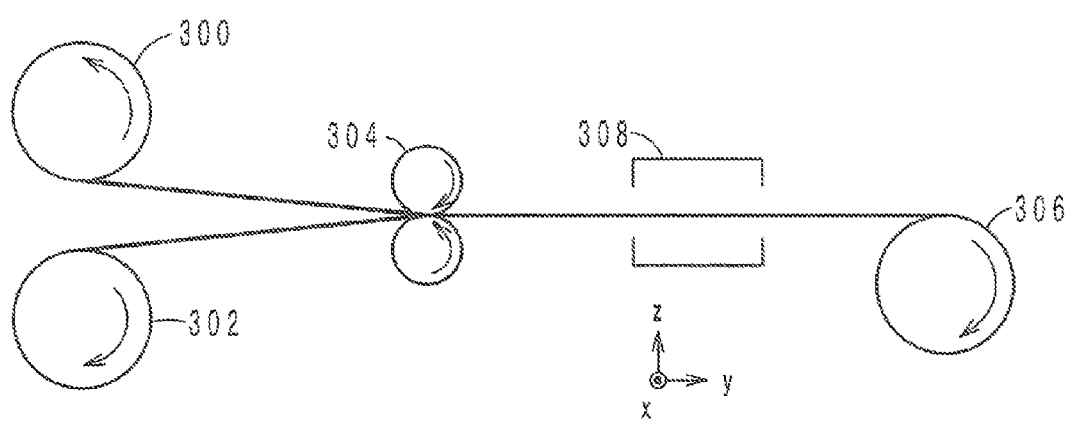
FIG. 21 is a diagram describing the process of bonding the mother sheets under pressure.

Next, the method for producing the high-frequency signal line 10*h* will be described with reference to the drawings. FIGS. 20A and 20B are diagrams illustrating mother sheets 118*a*, 118*b*, and 119*a*. FIG. 21 is a diagram describing the process of bonding the mother sheets 118*a*, 118*b*, and 119*a* under pressure.

First, there is prepared a mother sheet 118*a* made of thermoplastic resin and having one principal surface entirely copper-foiled. Further, there is prepared a mother sheet 118*b* made of thermoplastic resin and having both principal surfaces entirely copper-foiled. The mother sheets 118*a* and 118*b* are large-sized sheets to be cut into dielectric sheets 18*a* and 18*b*. The copper-foiled surfaces of the mother sheets 118*a* and 118*b* are smoothened, for example, by galvanization for rust prevention. The thickness of the copper foil preferably is from about 10 μm to about 20 μm, for example.

Next, external terminals 16*a* and 16*b* and reference ground conductors 22, as shown in FIG. 20A, are formed on the top surface of the mother sheet 118*a* by photolithography. The reference ground conductors 22 are aligned in the y-axis direction, so as to extend in the x-axis direction. Thereafter, the mother sheet 118*a* with the external terminals 16*a* and 16*b* and the reference ground conductors 22 provided thereon is transported in the y-axis direction to be wound on a roller. The roller with the mother sheet 118*a* wound thereon will be referred to below as the roller 300.

Next, by photolithography, signal lines 20 shown in FIG. 20B are formed on the top surface of the mother sheet 118*b*, and auxiliary ground conductors 24 on the bottom surface of the mother sheet 118b. Both the signal lines 20 and the auxiliary ground conductors 24 are aligned in the y-axis direction, so as to extend in the x-axis direction. Thereafter, the mother sheet 118b with the signal lines 20 and the auxiliary ground conductors 24 provided thereon is transported in the y-axis direction to be wound on a roller.

Furthermore, the mother sheet 119a is placed on the top surface of the mother sheet 118b, as shown in FIG. 20B, while the mother sheet 118b is being fed from the roll, and thereafter, the mother sheet 118b is wound again, along with the mother sheet 119a. The mother sheet 119a is a large-sized sheet to be cut into adhesive layers 19a. The mother sheet 119a is made of a material having a lower softening point than the material of the mother sheets 118a and 118b. For example, in the case where the mother sheets 118a and 118b are made of liquid crystal polymer, the mother sheet 119c is made of liquid crystal polymer having a lower softening point than the liquid crystal polymer of the mother sheets 118a and 118b. The roller with the mother sheets 118b and 119a wound thereon will be referred to below as the roller 302. Note that an example of the material of the adhesive layer 19a is a resin material having a lower softening point than the thermoplastic resin used for the mother sheets 118a and 118b. However, the adhesive layer 19a is similar in electrical characteristics to the mother sheets 118a and 118b, and therefore, the material used for the adhesive layer 19a may be a material having the same composition system as the mother sheets 118a and 118b but a lower softening point than the mother sheets 118a and 118b.

Next, the mother sheets 118a, 118b, and 119a are fed from the rollers 300 and 302 in a state where they are arranged in the order: 118a, 119a, and 118b, so that they are subjected to pressure bonding by a pair of pressure rollers 304, as shown in FIG. 21. At this time, the pressure rollers 304 also heat the mother sheets 118a, 118b, and 119a. In this process, the mother sheets 118a, 118b, and 119a are heated at such a temperature that softens only the mother sheet 119a but not the mother sheets 118a and 118b. As a result, the mother sheets 118a and 118b are bonded by the mother sheet 119a.

Furthermore, through-holes are provided by a through-hole forming device 308, as shown in FIG. 21, irradiating the mother sheets 118a, 118b, and 119a with laser beams where through-hole conductors T1 are to be formed. Thereafter, the through-hole forming device 308 fills the through-holes with metal by Ni/Au plating, thus forming the through-hole conductors T1. As a result of the plating, Ni/Au plating films are formed also on the surfaces of the external terminals 16a and 16b and the terminal portions 22b and 22c. Thereafter, the mother sheets 118a, 118b, and 119a are wound on the roller 306.

Next, a resin (resist) paste is applied to the mother sheets 118a and 118b, while the mother sheets 118a, 118b, and 119a are being fed from the roller 306, thereby forming protective layers 14 and 15 respectively on the top surface of the mother sheet 118a and the bottom surface of the mother sheet 118b. Further, the connectors 100a and 100b are mounted on the top surface of the mother sheet 118a.

Lastly, the mother sheets 118a, 118b, and 119a are punched into a predetermined shape, thus obtaining high-frequency signal lines 10h.

In the above method for producing the high-frequency signal line 10h, both the signal lines 20 and the auxiliary ground conductors 24 are aligned in the y-axis direction, so as to extend in the x-axis direction. Therefore, in the process of bonding the mother sheets 118a and 118b, as shown in FIG. 21, the signal lines 20 are not pulled in the direction in which they extend. Thus, the signal lines 20 are inhibited from being broken.

Ninth Modification

Hereinafter, a high-frequency signal line according to a ninth modification of a preferred embodiment of the present invention will be described with reference to the drawings. FIG. 22 is a cross-sectional structure view of the high-frequency signal line 10i according to the ninth modification.

The high-frequency signal line 10i differs from the high-frequency signal line 10 in that the reference ground conductor 22 is provided on the bottom surface of the dielectric sheet 18a, and a dielectric sheet 18c is additionally provided.

More specifically, the reference ground conductor 22 is positioned on the bottom surface of the dielectric sheet 18a, as shown in FIG. 22. Here, the reference ground conductor 22 is formed on the bottom surface of the dielectric sheet 18a preferably by patterning metal foil formed by plating the bottom surface of the dielectric sheet 18a or by patterning metal foil attached to the bottom surface of the dielectric sheet 18a. Moreover, the top surface of the reference ground conductor 22 is smoothened, so that surface roughness of the reference ground conductor 22 is greater on the side that contacts the dielectric sheet 18a than on the side that does not contact the dielectric sheet 18a. Note that in the high-frequency signal line 10i, the surface with lower surface roughness is directed toward the negative side in the z-axis direction.

Furthermore, in the high-frequency signal line 10i, since the reference ground conductor 22 is provided on the bottom surface of the dielectric sheet 18a, the dielectric sheet 18c is provided between the dielectric sheets 18a and 18b in order to insulate the reference ground conductor 22 from the signal line 20. Therefore, the signal line 20 and the reference ground conductor 22 are opposite to each other with the dielectric sheet 18c positioned therebetween. Further, both of the surfaces of the signal line 20 and the reference ground conductor 22 that are opposed to each other have low surface roughness.

In the high-frequency signal line 10i as described above, a high-frequency signal flows near the top surface of the signal line 20 because of the skin effect. Further, a return current of the high-frequency signal flows at the surface of the reference ground conductor 22 that is opposed to the signal line 20. Accordingly, when both the surface of the signal line 20 that is opposed to the reference ground conductor 22 and the surface of the reference ground conductor 22 that is opposed to the signal line 20 are reduced in roughness, their resistance values also decrease. As a result, the high-frequency signal line 10i has an insertion loss that is significantly reduced, minimized or prevented.

OTHER PREFERRED EMBODIMENTS

The present invention is not limited to the high-frequency signal lines 10 and 10a to 10i according to the above preferred embodiments and modifications thereof, and variations can be made within the spirit and scope of the present invention.

Note that in the high-frequency signal lines 10 and 10a to 10i, all openings 30 preferably have the same shape, for example. However, some of the openings 30 may differ in shape from the rest of the openings 30. For example, all openings 30, excluding predetermined openings 30, may be larger in length in the x-axis direction than the predetermined openings 30. As a result, the high-frequency signal lines 10 and 10a to 10f is easily bent in the regions where the predetermined openings 30 are provided.

Further, the configuration of the high-frequency signal lines 10 and 10a to 10i may be used in combination.

Still further, in the high-frequency signal lines 10a to 10i, the characteristic impedance of the signal line 20 between two adjacent bridge portions 60 preferably increases in the order: minimum value Z2, intermediate value Z3, and maximum value Z1, in the direction from one of the bridge portions 60 toward the other, and thereafter, preferably decreases in the order: maximum value Z1, intermediate value Z3, and minimum value Z2. However, the characteristic impedance of the signal line 20 between two adjacent bridge portions 60 may increase in the order: minimum value Z2, intermediate value Z3, and maximum value Z1, in the direction from one of the bridge portions 60 toward the other, and thereafter, decrease in the order: maximum value Z1, intermediate value Z4, and minimum value Z2. That is, there may be provided the intermediate value Z4 different from the intermediate value Z3. For example, the openings 30, 31, 44a, and 44 may be in shapes asymmetric with respect to line A. However, the intermediate value Z4 is required to be larger than the minimum value Z2 but smaller than the maximum value Z1.

Yet further, the minimum value Z2 may vary between two adjacent bridge portions 60. More specifically, for each of the high-frequency signal lines 10a to 10i, the minimum value Z2 is not required to be constant so long as the characteristic impedance of the entire high-frequency signal line has a predetermined value. However, the minimum value Z2 for one bridge portion 60 is required to be lower than the intermediate value Z3, and the minimum value Z2 for the other bridge portion 60 is required to be lower than the intermediate value Z4.

Note that the high-frequency signal lines 10 and 10a to 10i preferably include a plurality of openings 30 provided along the signal line 20, but the number of openings 30 may be one. In such a case, the opening 30 is in the form of a slit extending in the x-axis direction so as to overlap with the signal line 20.

Furthermore, the high-frequency signal lines 10 and 10a to 10i may be used on RF circuit boards such as antenna front end modules.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal line comprising:
   a laminate including a plurality of insulator layers;
   a signal line provided on a first principal surface of one of the insulator layers;
   a first ground conductor provided on a second principal surface of the insulator layer provided with the signal line, the first ground conductor including openings that overlap with the signal conductor; and
   a second ground conductor provided in or on the laminate so as to be opposed to the first ground conductor with the signal conductor positioned therebetween; wherein
   no openings are provided in an entire portion of the second ground conductor to which the signal line is opposed; and
   a surface roughness of the signal line is less on a side that is opposed to the second ground conductor than on a side that is opposed to the first ground conductor.

2. The high-frequency signal line according to claim 1, wherein the signal conductor is less distant from the first ground conductor than from the second ground conductor.

3. The high-frequency signal line according to claim 1, wherein the laminate is flexible.

4. The high-frequency signal line according to claim 1, wherein:
   the surface roughness of the signal line is greater on a side that contacts the first principal surface of the insulator layer than on a side that does not contact the first principal surface of the insulator layer; and
   a surface roughness of the first ground conductor is greater on a side that contacts the second principal surface of the insulator layer than on a side that does not contact the second principal surface of the insulator layer.

5. The high-frequency signal line according to claim 1, wherein
   the laminate includes first and second insulator layers stacked therein;
   the signal conductor is positioned on the first principal surface of the first insulator layer;
   the first ground conductor is positioned on the second principal surface of the first insulator layer;
   the second ground conductor is positioned on a first principal surface of the second insulator layer; and
   the first insulator layer is positioned above the second insulator layer such that the first principal surface of the first insulator layer is opposed to a second principal surface of the second insulator layer.

6. The high-frequency signal line according to claim 5, wherein the first insulator layer and the second insulator layer are bonded by an insulating adhesive layer provided therebetween.

7. The high-frequency signal line according to claim 5, further comprising:
   a first protective layer covering the first ground conductor; and
   a second protective layer covering the second ground conductor.

8. An electronic device comprising:
   a housing; and
   a high-frequency signal line accommodated in the housing; wherein
   the high-frequency signal line includes:
     a laminate including a plurality of insulator layers;
     a signal line provided on a first principal surface of one of the insulator layers;
     a first ground conductor provided on a second principal surface of the insulator layer provided with the signal line, the first ground conductor including openings that overlap with the signal conductor; and
     a second ground conductor provided in or on the laminate so as to be opposed to the first ground conductor with the signal conductor positioned therebetween; wherein
   no openings are provided in an entire portion of the second ground conductor to which the signal conductor is opposed; and
   a surface roughness of the signal line is less on a side that is opposed to the second ground conductor than on a side that is opposed to the first ground conductor.

9. The electronic device according to claim 8, wherein:
   the surface roughness of the signal line is greater on a side that contacts the first principal surface of the insulator layer than on a side that does not contact the first principal surface of the insulator layer; and a surface roughness of the first ground conductor is greater on a side that contacts the second principal surface of the insulator layer than on a side that does not contact the second principal surface of the insulator layer.

10. The electronic device according to claim 8, wherein the laminate includes first and second insulator layers stacked therein;

the signal conductor is positioned on the first principal surface of the first insulator layer;

the first ground conductor is positioned on the second principal surface of the first insulator layer;

the second ground conductor is positioned on a first principal surface of the second insulator layer; and the first insulator layer is positioned above the second insulator layer such that the first principal surface of the first insulator layer is opposed to a second principal surface of the second insulator layer.

11. The electronic device according to claim 10, wherein the first insulator layer and the second insulator layer are bonded by an insulating adhesive layer provided therebetween.

12. The electronic device according to claim 10, further comprising:

a first protective layer covering the first ground conductor; and a second protective layer covering the second ground conductor.

13. A high-frequency signal line comprising:

a laminate including a plurality of insulator layers;

a signal line provided on a first principal surface of one of the insulator layers;

a first ground conductor provided on a second principal surface of the insulator layer provided with the signal line, the first ground conductor including openings that overlap with the signal conductor; and a second ground conductor provided in or on the laminate so as to be opposed to the first ground conductor with the signal conductor positioned therebetween; wherein a surface roughness of the signal line is greater on a side that contacts the first principal surface of the insulator layer than on a side that does not contact the first principal surface of the insulator layer; and a surface roughness of the first ground conductor is greater on a side that contacts the second principal surface of the insulator layer than on a side that does not contact the second principal surface of the insulator layer.

14. An electronic device comprising:

a housing; and a high-frequency signal line accommodated in the housing; wherein the high-frequency signal line includes:

a laminate including a plurality of insulator layers;

a signal line provided on a first principal surface of one of the insulator layers;

a first ground conductor provided on a second principal surface of the insulator layer provided with the signal line, the first ground conductor including openings that overlap with the signal conductor; and a second ground conductor provided in or on the laminate so as to be opposed to the first ground conductor with the signal conductor positioned therebetween; wherein a surface roughness of the signal line is greater on a side that contacts the first principal surface of the insulator layer than on a side that does not contact the first principal surface of the insulator layer; and a surface roughness of the first ground conductor is greater on a side that contacts the second principal surface of the insulator layer than on a side that does not contact the second principal surface of the insulator layer.

\* \* \* \* \*